(12) United States Patent
Kato et al.

(10) Patent No.: US 10,329,509 B2
(45) Date of Patent: Jun. 25, 2019

(54) AMORPHOUS HYDROCARBON BASED FILM, AND SLIDING MEMBER AND SLIDING SYSTEM WITH SAID FILM

(71) Applicants: JTEKT CORPORATION, Osaka-shi, Osaka (JP); THE UNIVERSITY OF TOKYO, Tokyo (JP)

(72) Inventors: Takahisa Kato, Tokyo (JP); Masataka Nosaka, Tokyo (JP); Mamoru Tohyama, Nagakute (JP); Atsushi Murase, Nagakute (JP); Kyoko Nakai, Nagakute (JP); Masahiro Suzuki, Kashiba (JP)

(73) Assignees: JTEKT CORPORATION, Osaka-shi (JP); THE UNIVERSITY OF TOKYO, Tokyo (JP)

( * ) Notice: Subject to any disclaimer, the term of this patent is extended or adjusted under 35 U.S.C. 154(b) by 0 days.

(21) Appl. No.: 15/547,754

(22) PCT Filed: Jan. 29, 2016

(86) PCT No.: PCT/JP2016/052679
§ 371 (c)(1),
(2) Date: Jul. 31, 2017

(87) PCT Pub. No.: WO2016/121936
PCT Pub. Date: Aug. 4, 2016

(65) Prior Publication Data
US 2018/0023016 A1    Jan. 25, 2018

(30) Foreign Application Priority Data

Jan. 29, 2015 (JP) ................................. 2015-015850
Jan. 29, 2015 (JP) ................................. 2015-015851
(Continued)

(51) Int. Cl.
    *B05D 5/08*     (2006.01)
    *C23C 16/26*    (2006.01)
    (Continued)

(52) U.S. Cl.
    CPC ............. *C10M 105/04* (2013.01); *B05D 5/08* (2013.01); *C10M 103/02* (2013.01);
    (Continued)

(58) Field of Classification Search
    CPC .. C10M 2201/0413; C10M 2203/0206; C10M 2203/065; C10N 2250/08
    See application file for complete search history.

(56) References Cited

U.S. PATENT DOCUMENTS 5,115,007 A    5/1992   Chihara et al.
5,629,082 A    5/1997   Baureis et al.
(Continued)

FOREIGN PATENT DOCUMENTS

CN    101578389 A    11/2009
CN    103228817 A     7/2013
(Continued)

OTHER PUBLICATIONS

Mar. 8, 2016 International Search Report issued in International Patent Application No. PCT/JP2016/052679.
(Continued)

*Primary Examiner* — Vishal V Vasisth
(74) *Attorney, Agent, or Firm* — Oliff PLC

(57) ABSTRACT

A low-friction coating includes: an aliphatic hydrocarbon group showing a peak in a region of 2,900 $cm^{-1}$ to 3000 $cm^{-1}$ in an infrared absorption spectrum; a carbonyl group showing a peak in a region of 1,650 $cm^{-1}$ to 1,800 $cm^{-1}$ in an infrared absorption spectrum; an aromatic component ($C_7H_7^+$) showing a peak at mass 91.1 in a positive ion spectrum obtained by TOF-SIMS; and a condensed ring
(Continued)

based component ($C_9H_7^+$) showing a peak at mass 115.2 in the positive ion spectrum obtained by TOF-SIMS.

8 Claims, 27 Drawing Sheets

(30) Foreign Application Priority Data

Jan. 19, 2016 (JP) .................................. 2016-008236
Jan. 19, 2016 (JP) .................................. 2016-008237

(51) Int. Cl.

| | | |
|---|---|---|
| C23C 16/44 | (2006.01) | |
| C23C 16/50 | (2006.01) | |
| F16C 17/00 | (2006.01) | |
| F16C 33/12 | (2006.01) | |
| C10M 103/02 | (2006.01) | |
| C10M 105/04 | (2006.01) | |
| C10M 105/06 | (2006.01) | |
| C10M 105/08 | (2006.01) | |
| C10M 109/02 | (2006.01) | |
| C10M 177/00 | (2006.01) | |

(52) U.S. Cl.
CPC ........ *C10M 105/06* (2013.01); *C10M 105/08* (2013.01); *C10M 109/02* (2013.01); *C10M 177/00* (2013.01); *C23C 16/26* (2013.01); *C23C 16/44* (2013.01); *C23C 16/50* (2013.01); *F16C 17/00* (2013.01); *F16C 33/121* (2013.01); *C10M 2201/0413* (2013.01); *C10M 2203/0206* (2013.01); *C10M 2203/065* (2013.01); *C10N 2230/06* (2013.01); *C10N 2250/08* (2013.01); *C10N 2250/121* (2013.01); *F16C 2206/02* (2013.01); *F16C 2206/48* (2013.01)

(56) References Cited

U.S. PATENT DOCUMENTS

| | | | |
|---|---|---|---|
| 6,354,008 B1 * | 3/2002 | Domoto | B26B 19/38 30/346.53 |
| 8,322,265 B1 | 12/2012 | Singer | |
| 2002/0022129 A1 | 2/2002 | Moronuki | |
| 2006/0035068 A1 | 2/2006 | Ochiai et al. | |
| 2006/0210833 A1 | 9/2006 | Saito et al. | |
| 2006/0263604 A1 | 11/2006 | Martin et al. | |
| 2007/0060483 A1 | 3/2007 | Konishi et al. | |
| 2007/0078067 A1 | 4/2007 | Nakagawa et al. | |
| 2007/0249507 A1 | 10/2007 | Okamoto et al. | |
| 2008/0146468 A1 | 6/2008 | Konishi et al. | |
| 2008/0188383 A1 | 8/2008 | Iseki et al. | |
| 2008/0254217 A1 | 10/2008 | Boroson | |
| 2009/0186783 A1 | 7/2009 | Martin et al. | |
| 2010/0086398 A1 | 4/2010 | Ochiai et al. | |
| 2010/0314005 A1 | 12/2010 | Saito et al. | |
| 2012/0248711 A1 | 10/2012 | Iwashita et al. | |
| 2012/0308949 A1 | 12/2012 | Hirose et al. | |
| 2013/0036935 A1 | 2/2013 | Bauer et al. | |
| 2013/0190216 A1 | 7/2013 | Martin et al. | |
| 2013/0252860 A1 | 9/2013 | Komori | |
| 2014/0128298 A1 | 5/2014 | Becker et al. | |

FOREIGN PATENT DOCUMENTS

| | | | |
|---|---|---|---|
| JP | 2000-144378 | A | 5/2000 |
| JP | 2002-097573 | A | 4/2002 |
| JP | 2004-155146 | A | 6/2004 |
| JP | 2005-098495 | A | 4/2005 |
| JP | 2005-145720 | A | 6/2005 |
| JP | 2006-291355 | A | 10/2006 |
| JP | 2007-32360 | A | 2/2007 |
| JP | 2007-099947 | A | 4/2007 |
| JP | 2008-522020 | A | 6/2008 |
| JP | 2010-525163 | A | 7/2010 |
| JP | 2012-092351 | A | 5/2012 |
| JP | 2012-246545 | A | 12/2012 |
| WO | 2004/029329 | A1 | 4/2004 |

OTHER PUBLICATIONS

Mar. 8, 2016 Written Opinion of the International Searching Authority issued in International Patent Application No. PCT/JP2016/052679.

Mar. 8, 2016 International Search Report issued in International Patent Application No. PCT/JP2016/052680.

Mar. 8, 2016 Written Opinion of the International Searching Authority issued in International Patent Application No. PCT/JP2016/052680.

U.S. Appl. No. 15/547,728, filed Jul. 31, 2017 in the name of Kato et al.

Nov. 5, 2018 Office Action issued in U.S. Appl. No. 15/547,728.

Jan. 24, 2019 Office Action issued in Chinese Patent Application No. 201680008136.4.

Berman et al., "Few Layer Graphene to Reduce Wear and Friction on Sliding Steel Surfaces," Carbon, vol. 54, pp. 454-459, 2013.

Peng et al., "Effects of Surface Coating Preparation and Sliding Modes on Titanium Oxide Coated Titanium Alloy for Aerospace Applications," International Journal of Aerospace Engineering, vol. 2014, Article ID 640364, 10 pages, May 6, 2014.

Bachmann et al., "Ultra-Low Friction on Tetrahedral Amorphous Diamond-Like Carbon (ta—C) Lubricated with Ethylene Glycol," Lubricants, vol. 6, No. 59, pp. 1-14, 2018.

Zhang et al., "Low Friction of Diamond Sliding Against Al2O3 Ceramic Ball Based on the First Principles Calculations," Surface & Coatings Technology, vol. 283, pp. 129-134, 2015.

Mar. 11, 2019 Office Action issued U.S. Appl. No. 15/547,728.

* cited by examiner

| DLC composite films | HARD CARBON BASED FILM | |
|---|---|---|
| | Si-DLC | PLC |
| Deposition pressure, Pa | 0.28 | 0.24 |
| Bias voltage, kV | -2.0 | -0.4 |
| Heater temperature, K | 503 | |
| Film thickness, nm | 275 | 100 |
| Indentation hardness, GPa | 12.6 | |
| Young's modulus, GPa | 141 | |
| G-peak position, cm$^{-1}$ | 1521 | |
| FWHM(G), cm$^{-1}$ | 181 | |
| I(D)/I(G) | 0.49 | |
| Estimated hydrogen content, at.% | 11 | |

FIG. 8A
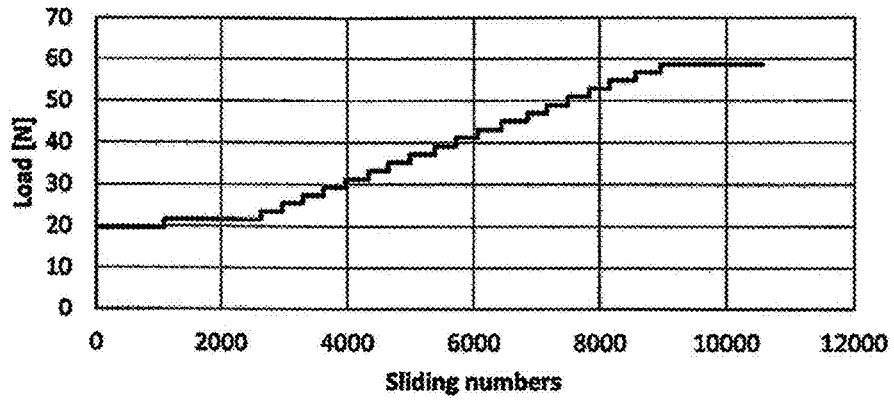
FIG. 8B
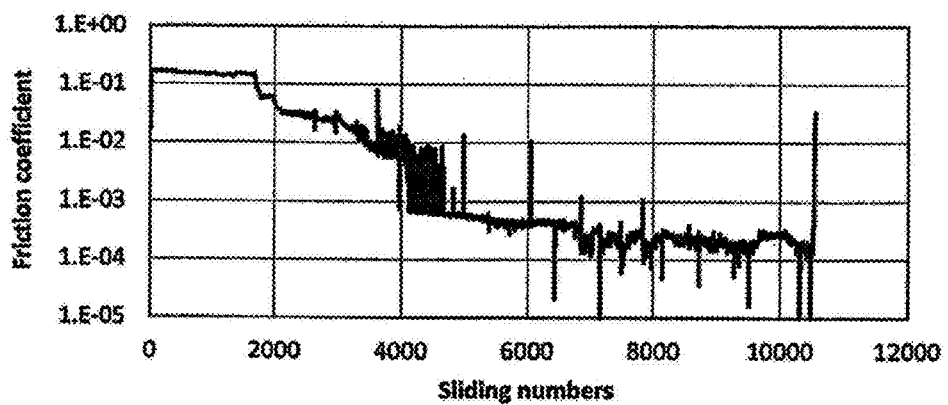
FIG. 9
| Surface layer | H-PLC |
|---|---|
| Source gas | $C_7H_8$ 4sccm $H_2$ 16sccm |
| Coating time [min] | 120 |
| Heater temperature [°C] | 230 |
| Bias voltage [kV] | -4.0 |

FIG. 10A

| Test No. | Run-in environment | | | FFO environment | | |
| --- | --- | --- | --- | --- | --- | --- |
| | Main flow | Sub flow 1 | Sub flow 2 | Main flow | Sub flow 1 | Sub flow 2 |
| 3 | N2 5slm | 23%@ 180sccm | 100%@ 5sccm | N2 5slm | 23%@ 40→20sccm | 100%@ 5→1sccm |
| 4 | N2 5slm | 20%@ 180sccm | --- | N2 5slm | 20%@ 40→30sccm | --- |

FIG. 10B

| Test No. | Surface | ZrO2 pin | Friction environment | FFO duration at 63.7 N without tribofilm rupture |
| --- | --- | --- | --- | --- |
| 3 | H-PLC | ZrO2 | N2 | 49min |
| 4 | | | | 10min |

SLIDING DIRECTION

SLIDING DIRECTION

SLIDING DIRECTION

AMORPHOUS HYDROCARBON BASED FILM, AND SLIDING MEMBER AND SLIDING SYSTEM WITH SAID FILM

This application is a 371 of PCT/JP2016/052679, filed Jan. 29, 2016.

TECHNICAL FIELD

The present invention relates to an amorphous hydrocarbon based film, and a sliding member and a sliding system with the same film.

BACKGROUND ART

In order to reduce friction of a sliding system, it has been proposed to dispose a solid lubricant film on a sliding surface of a sliding member. For example, a DLC (Diamond Like Carbon) film is known as such a solid lubricant film. The following Patent Literature 1 discloses a low-friction sliding mechanism by which a low-friction agent composition containing an oxygen-containing organic compound or a fatty amine compound is supplied to a sliding surface including a DLC film.

In addition, the following Patent Literature 2 discloses a low-friction lubrication assembly including a first member having a first sliding surface, and a second member having a second sliding surface. The first sliding surface has chemical affinity to O—H groups. The second sliding surface has an O—H terminal sliding surface. An oxygen-containing organic compound (liquid lubricant) is supplied between the first and second sliding surfaces so that a tribo-film with hydrogen as a terminal can be formed between the first and second sliding surfaces.

RELATED ART DOCUMENTS

Patent Documents

Patent Literature 1: JP-A-2005-98495
Patent Literature 2: JP-A-2012-92351

SUMMARY OF THE INVENTION

Problem to be Solved by the Invention

In the low-friction sliding mechanism disclosed in Patent Literature 1 and the low-friction lubrication assembly disclosed in Patent Literature 2, it is intended to reduce a friction coefficient of a sliding portion.

However, in Patent Literature 1 and Patent Literature 2, sliding is performed in a state (fluid lubrication) where a liquid lubricant is supplied onto a sliding surface. That is, in Patent Literature 1 and Patent Literature 2, friction reduction cannot be provided in conditions (dry lubrication) where a lubricant such as a liquid lubricant is not used additionally.

It is requested to reduce the friction coefficient of the sliding surface (sliding portion) without using any additional lubricant. Further, it is also desired to further reduce the friction coefficient of the sliding surface in order to further increase the efficiency of the sliding system.

Therefore, an object of the invention is to provide an amorphous hydrocarbon based film providing a low friction coefficient.

In addition, another object of the invention is to provide a sliding member capable of reducing a friction coefficient of a sliding surface without using any additional lubricant.

Further another object of the invention is to provide a sliding system capable of reducing a friction force generated between a sliding surface and a slid surface without using any additional lubricant, and thereby reducing loss in friction on a large scale.

Means for Solving the Problem

A first configuration of the invention provides an amorphous hydrocarbon based film (5) including an aliphatic hydrocarbon group showing a peak in a region of from 2,900 $cm^{-1}$ to 3,000 $cm^{-1}$ in an infrared absorption spectrum, and at least one of an aromatic component ($C_7H_7^+$) showing a peak at a mass of 91.1 in a positive ion spectrum obtained by time-of-flight secondary ion mass spectrometry (TOF-SIMS) and a condensed ring based component ($C_9H_7^+$) showing a peak at a mass of 115.2 in the positive ion spectrum obtained by the TOF-SIMS.

A second configuration of the invention provides an amorphous hydrocarbon based film according to the aforementioned first configuration, further including a carbonyl group showing a peak in a region of from 1,650 $cm^{-1}$ to 1,800 $cm^{-1}$ in an infrared absorption spectrum.

A third configuration of the invention provides an amorphous hydrocarbon based film according to the aforementioned first or second configuration, including both the aromatic component and the condensed ring based component.

A fourth configuration of the invention provides an amorphous hydrocarbon based film according to any one of the aforementioned first to third configurations, wherein an average thickness is 2 nm to 1,000 nm.

A fifth configuration of the invention provides a sliding member including a sliding surface (6) including a first coating (5), and a sliding member (2) formed of at least one of metal and ceramics, wherein the first coating includes an amorphous hydrocarbon based film (5) according to any one of the aforementioned first to fourth configurations.

A sixth configuration of the invention provides a sliding member according to the aforementioned fifth configuration, wherein the sliding member is formed of $ZrO_2$.

A seventh configuration of the invention provides a sliding system (1) including a sliding member (2) according to the aforementioned fifth or sixth configuration, and a slid member (3) including a slid surface (7) sliding against the sliding surface and including a second coating (9) made of an amorphous carbon based film, wherein the second coating has a Young's modulus of 200 GPa to 250 GPa.

An eighth configuration of the invention provides a sliding system according to the aforementioned seventh configuration, wherein the second coating includes a hydroxyl group in an outermost surface thereof, the hydroxyl group showing a peak in a region of from 3,000 $cm^{-1}$ to 4,000 $cm^{-1}$ in an infrared absorption spectrum.

Incidentally, in this article, numerical characters etc. in parentheses designate corresponding constituent elements etc. in embodiments which will be described later. Not to say, this does not mean that the invention should be limited to those embodiments.

Advantages of the Invention

According to the invention, an amorphous hydrocarbon based film including an aliphatic hydrocarbon group showing a peak in a region of from 2,900 $cm^{-1}$ to 3,000 $cm^{-1}$ in an infrared absorption spectrum, and at least one of an aromatic component showing a peak at a mass of 91.1 in a positive ion spectrum obtained by time-of-flight secondary ion mass spectrometry and a condensed ring based component showing a peak at a mass of 115.2 in the positive ion spectrum obtained by the time-of-flight secondary ion mass spectrometry shows a low friction coefficient. That is, it is possible to provide an amorphous hydrocarbon based film providing a low friction coefficient.

In addition, a first coating including the amorphous hydrocarbon based film is provided in a sliding surface of a sliding member formed of at least one of metal and ceramics, so that it is possible to reduce a friction coefficient of the sliding surface without using any additional lubricant.

Further, since the friction coefficient of the sliding surface can be reduced, a friction force generated between the sliding surface and a slid surface can be reduced without using any additional lubricant. Thus, loss in friction can be reduced on a large scale (friction torque can be reduced). Accordingly, it is possible to reduce the size and weight of a sliding system, and it is possible to improve the reliability of the sliding system.

BRIEF DESCRIPTION OF THE DRAWINGS

FIGS. 8A and 8B are graphs showing a relation between an applied load and a friction coefficient in the second friction test.

FIG. 9 is a table for explaining an upper layer of a plate test piece to be measured in each of third and fourth friction tests.

FIGS. 10A and 10B are tables for explaining test conditions of the third and fourth friction tests.

MODE FOR CARRYING OUT THE INVENTION

An embodiment of the invention will be described in detail below with reference to the accompanying drawings.

Figure 1:
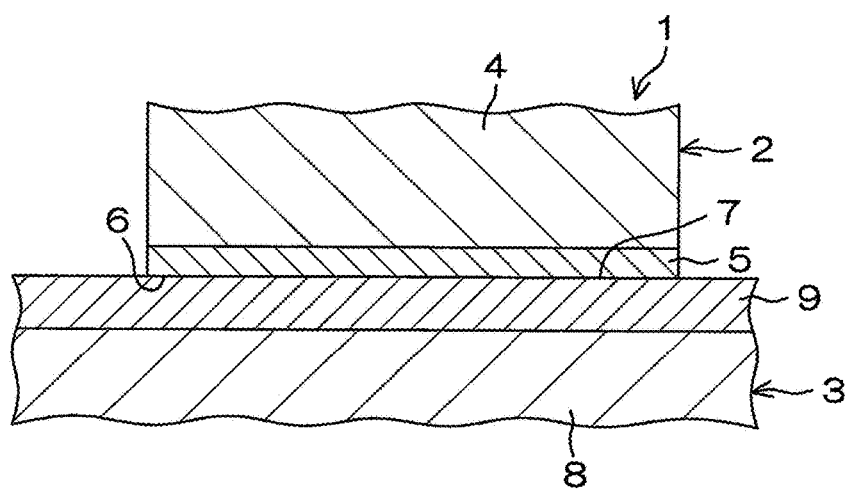
FIG. 1 is an enlarged sectional view showing a main portion of a sliding system according to an embodiment of the invention.

FIG. 1 is an enlarged sectional view showing a main portion of a sliding system 1 according to the embodiment of the invention. The sliding system 1 includes a sliding member 2, and a slid member 3 that is a mating material with the sliding member 2. The sliding member 2 is provided so that the sliding member 2 can slide relatively to the slid member 3. As for the sliding member 2 and the slid member 3, only the sliding member 2 may be slid (moved) against the slid member 3 standing still, or only the slid member 3 may be slid (moved) against the sliding member 2 standing still.

Alternatively, both the sliding member 2 and the slid member 3 may be moved to slid the sliding member 2 relatively to the slid member 3.

The sliding member 2 includes a first substrate 4 having a surface (lower surface in FIG. 1), and a low-friction coating (an amorphous hydrocarbon based film, a first coating) 5 with which at least a part of the surface of the first substrate 4 is covered. The first substrate 4 is formed of oxide ceramics (ceramics) or metal. For example, the oxide ceramics includes $ZrO_2$ (more specifically, yttrium-stabilized zirconia (YSZ)). The $ZrO_2$ may be subjected to heat treatment or not subjected to heat treatment. For example, the metal includes at least one of palladium (Pd) and SUJ2 (high-carbon chromium bearing-steel material). The oxide ceramics and the metal have catalytic properties capable of dissociating and adsorbing hydrogen molecules under a hydrogen atmosphere environment to thereby generate active hydrogen ($H^+$).

The low-friction coating 5 is an amorphous hydrocarbon based film. The low-friction coating 5 contains an aliphatic hydrocarbon group (such as an alkyl group), a carbonyl group (—C(=O)—), an aromatic component ($C_7H_7^+$), and a condensed ring based component ($C_9H_7^+$). The aliphatic hydrocarbon group shows a peak in a region of 2,900 $cm^{-1}$ to 3,000 $cm^{-1}$ in an infrared absorption spectrum (microscope transmission method). The carbonyl group shows a peak in a region of 1,650 $cm^{-1}$ to 1,800 $cm^{-1}$ in an infrared absorption spectrum (microscope transmission method). The aromatic component ($C_7H_7^+$) shows a peak at a mass of 91.1 in a positive ion spectrum obtained by TOF-SIMS (Time-Of-Flight Secondary Ion Mass Spectrometry). The condensed ring based component ($C_9H_7^+$) shows a peak at a mass of 115.2 in a positive ion spectrum obtained by TOF-SIMS. The low-friction coating 5 functions as a sliding surface 6 sliding against a slid surface 7 of the slid member 3.

Film thickness (average thickness) of the low-friction coating 5 is 2 nm to 1,000 nm. The film thickness is more preferably 2 nm to 500 nm.

The slid member 3 includes a second substrate 8 having a surface (upper surface in FIG. 1), and a PLC (Polymer-Like Carbon) film 9 with which at least a part of the surface of the second substrate 8 is covered. The second substrate 8 is formed of a steel material such as tool steel, carbon steel, stainless steel, chrome molybdenum steel, or high-carbon chromium bearing steel.

The PLC film 9 is an amorphous carbon based film, which contains short-chain polyacetylene based molecules as major component. The PLC film 9 is a coating formed by an ionization vapor deposition method with a low bias voltage or a high bias voltage applied thereto under an atmosphere environment of hydrocarbon based gas (such as toluene ($C_7H_8$)). The PLC film 9 has a Young's modulus of 200 GPa to 250 GPa. The outermost surface of the PLC film 9 shows a peak in a region of 3,000 $cm^{-1}$ to 4,000 $cm^{-1}$ in an infrared absorption spectrum (microscope transmission method). When an amorphous carbon based film is produced with a high bias voltage applied thereto, at least one of hydrogen and oxygen may be added to the amorphous carbon based film. The PLC film 9 functions as the slid surface 7 slidably contacting the sliding surface 6 of the sliding member 2. The sliding surface 6 and the slid surface 7 may be flat surfaces as shown in FIG. 1, or may be spherical surfaces or other surfaces.

No lubricant such as liquid lubricant is supplied to a sliding interface between the sliding surface 6 and the slid surface 7 (that is, between the low-friction coating 5 and the PLC film 9). That is, in the sliding system 1, sliding operation is carried out under non-lubrication conditions.

Examples of the sliding system 1 may include a bearing, a seal, a flywheel, scissors, a plunger pump, an artificial joint, etc. In addition, examples of the bearing may include a ball bearing, a roller bearing such as a tapered roller bearing, a bearing with separators, a slide bearing, etc.

When a ball bearing is used as the sliding system 1, the slid surface 7 where the PLC film 9 is disposed may include an inner surface of a cage, and the sliding surface 6 may include external surfaces of balls made of oxide ceramic (such as $ZrO_2$) or metal (such as SUJ2 or palladium). When an outer ring guide type ball bearing in which an outer diameter of a cage is guided by an inner circumference of an outer ring or an inner ring guide type ball bearing in which an inner diameter of a cage is guided by an outer circumference of an inner ring is used, the slid surface 7 where the PLC film 9 is disposed may include a guided surface of the cage, and the sliding surface 6 may include a guiding surface of the inner or outer ring guiding the cage and made of oxide ceramic (such as $ZrO_2$), metal (such as SUJ2 or palladium), or the like.

When a tapered roller bearing is used as the sliding system 1, the slid surface 7 where the PLC film 9 is disposed may include an end surface of a flange, and the sliding surface 6 may include an outer circumferential surface of a roller. Alternatively, the slid surface 7 where the PLC film 9 is disposed may include the outer circumferential surface of the roller, and the sliding surface 6 may include the end surface of the flange, which is made of oxide ceramics (such as $ZrO_2$) or metal (such as SUJ2 or palladium).

When a bearing with separators is used as the sliding system 1, the slid surface 7 where the PLC film 9 is disposed may include the separators, and the sliding surface 6 may include external surfaces of balls, which are made of oxide ceramics (such as $ZrO_2$) or metal (such as SUJ2 or palladium).

When a slide bearing is used as the sliding system 1, the slid surface 7 where the PLC film 9 is disposed may include an inner circumferential surface of the slide bearing, and the sliding surface 6 may include an outer circumferential surface of a shaft, which is made of oxide ceramics (such as $ZrO_2$) or metal (such as SUJ2 or palladium).

When a seal is used as the sliding system 1, the slid surface 7 where the PLC film 9 is disposed may include an outer circumferential surface of a shaft, and the sliding surface 6 may include a seal surface of the seal, which is made of oxide ceramics (such as $ZrO_2$) or metal (such as SUJ2 or palladium).

When scissors are used as the sliding system 1, the slid surface 7 where the PLC film 9 is disposed may include a blade surface of one of blades, and the sliding surface 6 may include a blade surface of the other blade, which is made of oxide ceramics (such as $ZrO_2$) or metal (such as SUJ2 or palladium).

When a plunger pump is used as the sliding system 1, the slid surface 7 where the PLC film 9 is disposed may include an external surface of a piston (plunger), and the sliding surface 6 may include a fixed cam plate, which is made of oxide ceramics (such as $ZrO_2$) or metal (such as SUJ2 or palladium).

When an artificial joint is used as the sliding system 1, the slid surface 7 where the PLC film 9 is disposed may include a reception-side contact surface, and the sliding surface 6 may include a bone-side contact surface, which is made of oxide ceramics (such as $ZrO_2$) or metal (such as SUJ2 or palladium).

In the sliding system 1 described above, the sliding surface 6 is provided in one member, and the slid surface 7 is provided in the other member. However, the sliding surface 6 may be provided in the other member, and the slid surface 7 may be provided in the one member.

Figure 2:
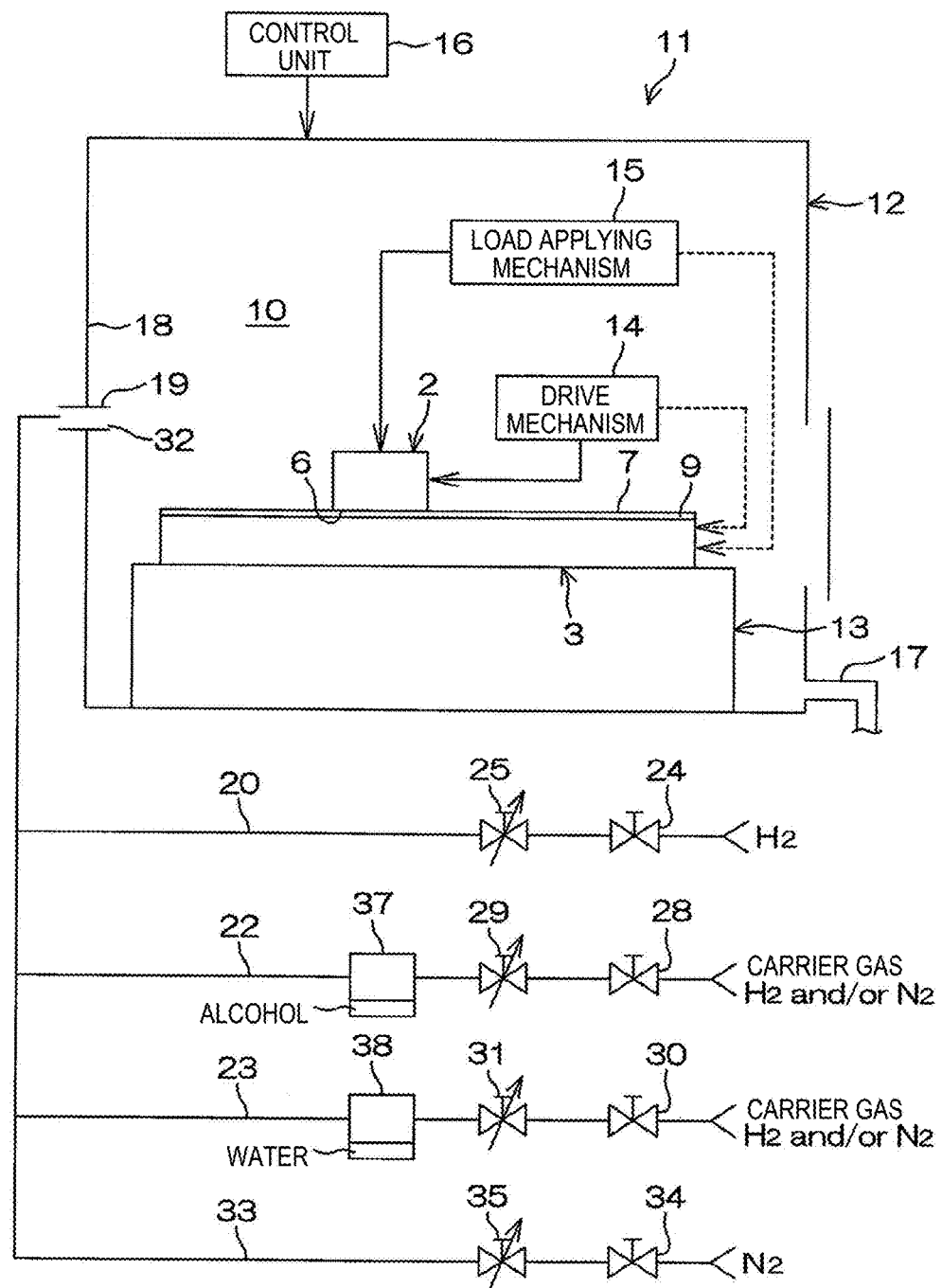
FIG. 2 is a schematic diagram showing a configuration of a film production apparatus for use in producing a low-friction coating included in a sliding member.

FIG. 2 is a schematic diagram showing a configuration of a film production apparatus 11 used in manufacturing the low-friction coating 5 contained in the sliding member 2. The film production apparatus 11 has a box-like chamber 12 including an internal space. The sliding member 2 and the slid member 3 are received in the internal space 10 of the chamber 12. The film production apparatus 11 further includes a holding base 13 provided in the internal space 10 of the chamber 12. In FIG. 2, the holding base 13 is a holding base for holding the slid member 3, and the holding base 13 is fixedly disposed in the internal space 10 of the chamber 12. The slid member 3 carried in the internal space 10 of the chamber 12 is mounted on the holding base 13, and held by the holding base 3. The sliding member 2 is mounted on the slid member 3.

In order to slide the sliding surface 6 of the sliding member 2 relatively to the slid surface 7 of the slid member 3, the film production apparatus 11 includes a drive mechanism 14 for driving (moving) the sliding member 2, and a load applying mechanism 15 for applying a pressing load to the sliding member 2 so as to press the sliding member 2 against the slid member 3. The drive mechanism 14 is, for example, a mechanism including a motor. In addition, the film production apparatus 11 includes a control unit 16 for controlling operation of each device provided in the film production apparatus 11 and opening/closing of each valve provided in the film production apparatus 11. The drive mechanism 14 is, for example, a direct motion device arranged by a combination of a motor and a ball screw. The load applying mechanism 15 is, for example, a weight.

An exhaust duct 17 for leading out gas from the internal space 10 of the chamber 12 is provided in a bottom portion of the chamber 12. Although FIG. 2 shows a configuration in which the exhaust duct 17 is provided in the bottom portion of the chamber 12, the exhaust duct 17 may be provided in another position than the bottom portion in the chamber 12.

Although description has been made in FIG. 2 on the assumption that the drive mechanism 14 and the load applying mechanism 15 are provided, the drive mechanism 14 and the load applying mechanism 15 do not have to be provided as long as the sliding member 2 and the slid member 3 are configured to slide against each other in a state where a load is applied between the sliding member 2 and the slid member 3.

In addition, a treatment gas introduction pipe 19 is provided to penetrate a wall (for example, a side wall 18) of the chamber 12. A hydrogen gas pipe 20, an alcohol pipe 22, a water pipe 23, and a nitrogen gas pipe 33 are connected to the treatment gas introduction pipe 19. To the hydrogen gas pipe 20, hydrogen gas ($H_2$) is supplied from a hydrogen gas supply source. To the alcohol pipe 22, alcohol as an example of a hydrocarbon based substance is supplied from an alcohol vessel 37. To the water pipe 23, water is supplied from a water vessel 38. To the nitrogen gas pipe 33, nitrogen gas ($N_2$) is supplied from a nitrogen gas supply source. A hydrogen gas valve 24 for opening/closing the hydrogen gas pipe 20 and a hydrogen gas flow rate regulating valve 25 for changing the opening degree of the hydrogen gas pipe 20 are placed in the hydrogen gas pipe 20. An alcohol valve 28 for opening/closing the alcohol pipe 22 and an alcohol flow rate regulating valve 29 for changing the opening degree of the alcohol pipe 22 are placed in the alcohol pipe 22. A water valve 30 for opening/closing the water pipe 23 and a water flow rate regulating valve 31 for changing the opening degree of the water pipe 23 are placed in the water pipe 23. A nitrogen gas valve 34 for opening/closing the nitrogen gas pipe 33 and a nitrogen gas flow rate regulating valve 35 for changing the opening degree of the nitrogen gas pipe 33 are placed in the nitrogen gas pipe 33. Liquid alcohol, gaseous alcohol vaporized from the liquid alcohol, and carrier gas are present as alcohol in the alcohol vessel 37. The temperature of the alcohol vessel 37 is set at 20° C.±5° C. Gaseous alcohol supplied from the alcohol vessel 37 and carrier gas supplied from the outside flow into the alcohol pipe 22. Liquid water and gaseous steam vaporized from the liquid water are present as water in the water vessel 38. The temperature of the water vessel 38 is set at 20° C.±5° C. Gaseous steam supplied from the water vessel 38 and carrier gas supplied from the outside flow into the water pipe 23.

The alcohol supplied into the treatment gas introduction pipe 19 includes at least one of methanol ($CH_3OH$), ethanol ($C_2H_5OH$), 1-propanol ($CH_3CH_2CH_2OH$), and 2-propanol ($CH_3CH(OH)CH_3$).

When the hydrogen gas valve 24 is opened in a state where the hydrogen gas pipe 20 has been set to have a large opening degree, a large flow rate of hydrogen is supplied from the hydrogen gas pipe 20 to the treatment gas introduction pipe 19. When the alcohol valve 28 and/or the water valve 30 are opened on this occasion, a small flow rate of alcohol gas and hydrogen gas ($H_2$) as carrier gas supplied from the outside and/or a small flow rate of steam and hydrogen gas ($H_2$) as carrier gas supplied from the outside are supplied into the treatment gas introduction pipe 19, and sufficiently mixed (agitated) with the large flow rate of hydrogen gas ($H_2$) as they flow through the treatment gas introduction pipe 19. Due to this mixture, special hydrogen gas (gas containing hydrogen and alcohol (hydroxyl group containing compound) and/or water (hydroxyl group containing compound)) is generated. The alcohol and/or the water have been vaporized in the generated special hydrogen gas. The generated special hydrogen gas is introduced into the internal space 10 of the chamber 12 from an inlet port 32 formed at a front end of the treatment gas introduction pipe 19. Thus, a special hydrogen gas atmosphere is obtained as the atmosphere of the internal space 10. Incidentally, the special hydrogen gas atmosphere does not contain oxygen.

When the nitrogen gas valve 34 is opened in a state where the nitrogen gas pipe 33 has been set to have a large opening degree, a large flow rate of nitrogen is supplied from the nitrogen gas pipe 33 to the treatment gas introduction pipe 19. When the alcohol valve 28 and/or the water valve 30 are opened on this occasion, a small flow rate of alcohol gas and nitrogen gas ($N_2$) as carrier gas supplied from the outside and/or a small flow rate of steam and nitrogen gas ($N_2$) as carrier gas supplied from the outside are supplied into the treatment gas introduction pipe 19, and sufficiently mixed (agitated) with the large flow rate of nitrogen gas ($N_2$) as they flow through the treatment gas introduction pipe 19. Due to this mixture, special nitrogen gas (gas containing nitrogen and alcohol (hydroxyl group containing compound) and/or water (hydroxyl group containing compound)) is generated. The alcohol and/or the water have been vaporized in the generated special nitrogen gas. The generated special nitrogen gas is introduced into the internal space 10 of the chamber 12. Thus, a special nitrogen gas atmosphere is obtained as the atmosphere of the internal space 10. Incidentally, the special nitrogen gas atmosphere does not contain oxygen.

When the alcohol valve 28 and/or the water valve 30 are opened in a state where the hydrogen gas valve 24 and the nitrogen gas valve 34 have been opened, special nitrogen/hydrogen gas (gas containing nitrogen and hydrogen, and alcohol (hydroxyl group containing compound) and/or water (hydroxyl group containing compound)) is generated. The generated special nitrogen/hydrogen gas is introduced into the internal space 10 of the chamber 12. Thus, a special nitrogen/hydrogen gas atmosphere is obtained as the atmosphere of the internal space 10. Incidentally, the special nitrogen/hydrogen gas atmosphere does not contain oxygen.

Figure 3A:
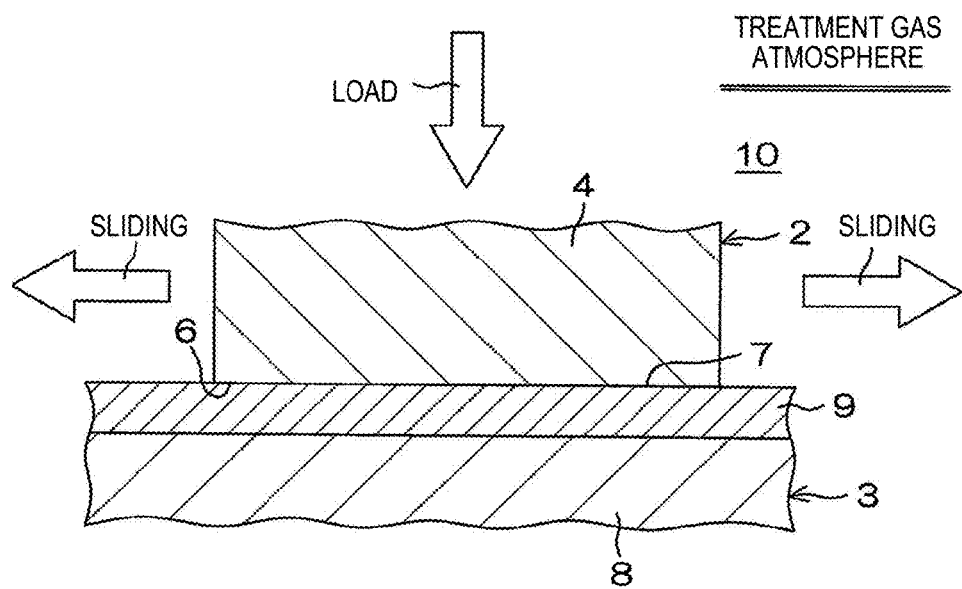
FIGS. 3A and 3B are sectional views showing a sliding operation between the sliding member and a slid member.
Figure 3B:
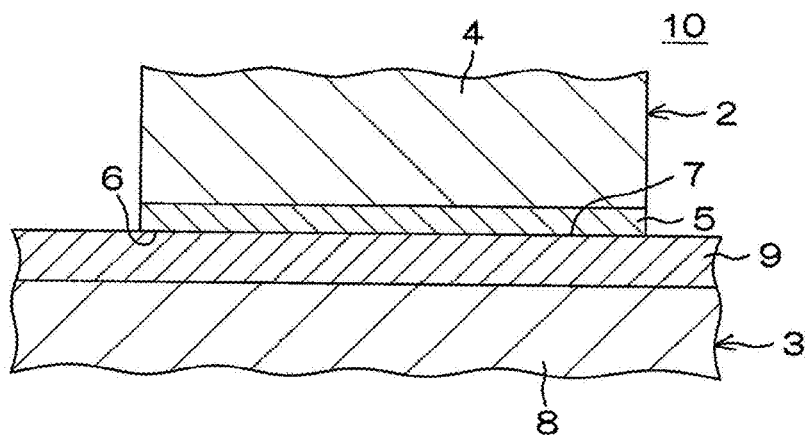

FIGS. 3A and 3B are sectional views showing a sliding operation between the sliding member 2 and the slid member 3. A production example in which the low-friction coating 5 is formed on the sliding surface 6 of the sliding member 2 by use of the film production apparatus 11 will be described below with reference to FIG. 2. FIGS. 3A and 3B will be referred to, as necessary.

In order to produce (form) the low-friction coating 5 by use of the film production apparatus 11, the sliding member 2 and the slid member 3 are carried into the internal space 10 of the chamber 12. The carried-in slid member 3 is mounted on the holding base 13 with the slid surface 7 upward. On the other hand, the carried-in sliding member 2 is mounted on the slid member 3 with the sliding surface 6 downward. Incidentally, the low-friction coating 5 is not formed on the sliding surface 6 of the sliding member 2 at the time when the sliding member 2 is carried into the internal space 10. That is, the sliding surface 6 is formed of oxide ceramics or metal.

After the sliding member 2 and the slid member 3 are carried into the internal space 10 of the chamber 12, the control unit 16 opens the hydrogen gas valve 24 and/or the nitrogen gas valve 34, and the alcohol valve 28 and/or the water valve 30 so as to supply treatment gas from the inlet port 32 of the treatment gas introduction pipe 19 to the internal space 10 of the chamber 12 (supply step). For example, assume that the treatment gas contains special hydrogen gas, and a very small amount of gaseous alcohol and a very small amount of gaseous steam are added to hydrogen gas in the special hydrogen gas. In addition to the hydrogen gas, the special hydrogen gas contains gaseous alcohol and gaseous steam, for example, at a volume ratio [alcohol/(alcohol+water)] of 4 to 44%. The volume ratio is a ratio of a flow rate of carrier gas including the gaseous alcohol in the alcohol vessel 37 to a total value of the flow rate of the carrier gas including the gaseous alcohol in the liquid alcohol vessel 37 and a flow rate of carrier gas including the gaseous water in the water vessel 38.

The treatment gas supplied into the chamber 12 spreads all over the internal space 10 of the chamber 12. Thus, the atmosphere (air) in the internal space 10 of the chamber 12 is substituted to an atmosphere containing the treatment gas. Incidentally, oxygen is not contained in the treatment gas.

After the internal space 10 of the chamber 12 is filled with the atmosphere of the treatment gas (in the state where the atmosphere of the treatment gas has been obtained in the internal space 10), the control unit 16 allowing the treatment gas to be continuously supplied controls the drive mechanism 14 to start sliding (sliding step) of the sliding surface 6 (sliding member 2) against the slid surface 7 (slid member 3) while applying a pressing load from the sliding surface 6 to the slid surface 7, as shown in FIG. 3A. Heltzian contact stress generated between the sliding surface 6 and the slid surface 7 during the sliding due to the applied pressing load is not smaller than 1.0 GPa. More preferably, the Heltzian contact stress is 1.3 Ga to 2.4 GPa.

When a predetermined period (for example, 30 minutes) has passed since the start of the sliding of the sliding surface 6, the alcohol valve 28 and the water valve 30 are closed to stop supplying the alcohol and the water to the internal space 10.

With the sliding surface 6 sliding against the slid surface 7, due to the catalytic effect of the sliding surface 6 ($ZrO_2$ or the like), the low-friction coating 5 is formed on the sliding surface 6 as a result of the sliding of the sliding surface 6 against the slid surface 7. The low-friction coating 5 shows an extremely low friction coefficient of $10^{-4}$ order (lower than 0.001). Due to the low-friction coating 5 provided on the sliding surface 6 of the sliding member 2, a friction-fade-out state (hereinafter referred to as "FFO") showing a friction coefficient of $10^{-4}$ order can be generated. To say other words, as a result of the sliding of the sliding surface 6 against the slid surface 7, the friction coefficient decreases gradually in accordance with friction, so that FFO can be generated.

The low-friction coating 5 is a transparent film having hardness equivalent to that of the PLL film 9 and showing interference fringes. Blisters (bubbles) are generated in the surface and inside of the low-friction coating 5.

The present inventor et. al regard a mechanism of forming the low-friction coating 5 (generating FFO) as follows.

That is, with the sliding (friction) of the sliding surface 6, the outermost surface of the PLC film 9 is made into abrasion powder due to the friction, and transferred to the sliding surface 6. That is, a transfer film transferred from the PLC film 9 is formed on the sliding surface 6. In accordance with the progress of sliding, the PLC film 9 and the transfer film rub against each other.

Metal (such as SUJ2 or palladium) or oxide ceramics ($ZrO_2$) forming the sliding surface 6 has catalytic properties capable of dissociating and adsorbing hydrogen molecules to thereby generate active hydrogen. Therefore, due to the catalytic effect of the sliding surface 6, active hydrogen can be provided in the sliding interface as a result of the sliding of the sliding surface 6 against the PLC film 9.

The alcohol contained in the atmosphere of the internal space 10 is hydrocracked by the acid catalytic effect of the active hydrogen in the sliding surface 6 so that volatile gas can be formed on the transfer film. It is therefore considered that a gas molecular layer of the volatile gas is formed in the frictional surface (sliding interface) of the transfer film. The gas molecular layer has a thickness corresponding to several molecules. It is therefore considered that FFO can be generated due to single-molecular-level gas lubrication of the volatile gas. That is, the low-friction coating 5 is formed based on the transfer film including the volatile gas layer.

In addition, in the embodiment, when a predetermined period has passed since the start of the sliding of the sliding surface 6, supplying alcohol and water is stopped. Thus, moisture (water) can be eliminated from the atmosphere of the internal space 10. Moisture (water) can serve as poison in catalyst to weaken the catalytic effect of oxide ceramics ($ZrO_2$) or metal (SUJ or palladium). Thus, when moisture (water) is eliminated, the catalytic effect of the oxide ceramics or the metal can be stabilized.

When a predetermined period has passed since the start of the sliding of the sliding surface 6, the control unit 16 closes the open valves (the hydrogen gas valve 24, the alcohol valve 28, the water valve 30, the nitrogen gas valve 34, etc.) to stop introducing the treatment gas from the treatment gas introduction pipe 19. After that, the control unit 16 carries out the sliding member 2 and the slid member 3 from the internal space 10 of the chamber 12.

When methanol is used as the alcohol, it is preferable that a ratio of a flow rate of carrier gas including gaseous methanol in the alcohol vessel 37 to a total of the flow rate of the carrier gas including the gaseous methanol in the alcohol vessel 37 and a flow rate of carrier gas including gaseous steam in the water vessel 38 is 6% to 15%. FFO can be generated even if the ratio of the flow rate of the carrier gas including the gaseous methanol in the alcohol vessel 37 to the total of the flow rate of the carrier gas including the gaseous methanol in the alcohol vessel 37 and the flow rate of the carrier gas including the gaseous steam in the water vessel 38 is another value (which may include 100%).

When ethanol is used as the alcohol, it is preferable that a ratio of a flow rate of carrier gas including gaseous ethanol in the alcohol vessel 37 to a total of the flow rate of the carrier gas including the gaseous ethanol in the alcohol vessel 37 and a flow rate of carrier gas including gaseous steam in the water vessel 38 is 6% to 30%. FFO can be generated even if the ratio of the flow rate of the carrier gas including the gaseous ethanol in the alcohol vessel 37 to the total of the flow rate of the carrier gas including the gaseous ethanol in the alcohol vessel 37 and the flow rate of the carrier gas including the gaseous steam in the water vessel 38 is another value (which may include 100%). However, FFO can be generated in a stable state and for a long time particularly when the ratio of the flow rate of the carrier gas including the gaseous ethanol in the alcohol vessel 37 to the total of the flow rate of the carrier gas including the gaseous ethanol in the alcohol vessel 37 and the flow rate of the carrier gas including the gaseous steam in the water vessel 38 is 15% to 25%.

Next, first to fourth friction tests performed by use of a first friction tester 41 will be described.

Figure 4:
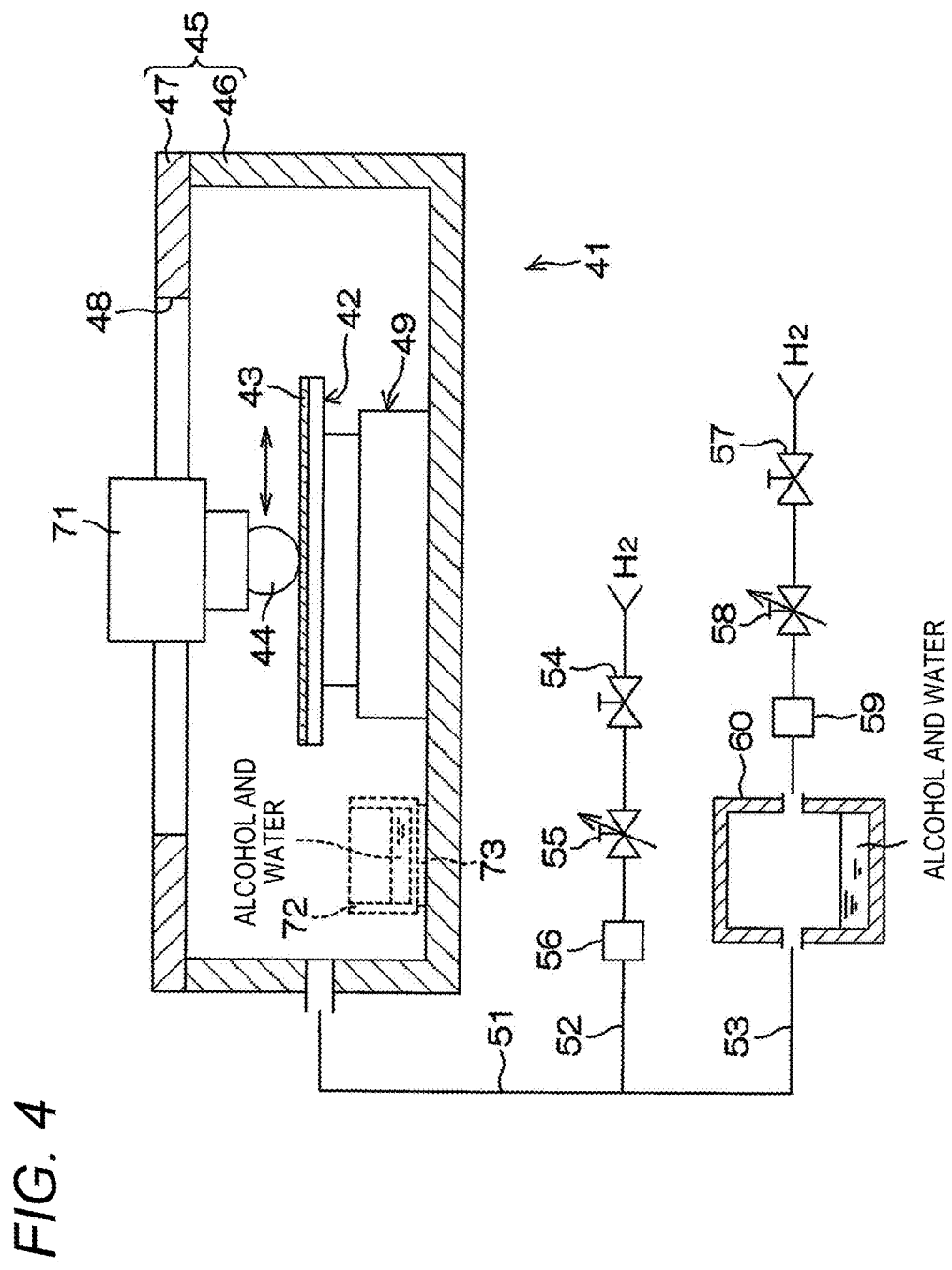
FIG. 4 is a schematic sectional view showing a configuration of a first friction tester.
Figures 5A, 5B:
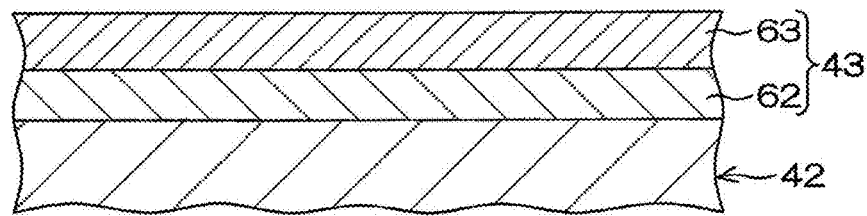
FIGS. 5A and 5B are a view and a table for explaining plate test pieces for use in first and second friction tests.

FIG. 4 is a schematic sectional view showing a configuration of the first friction tester 41. FIG. 5A is an enlarged sectional view showing a surface of each of plate test pieces 42 to be measured in the first and second friction tests. FIG. 5B is a table showing physical properties and a film production method of a two-layered film 43 formed in the surface of the place test piece 42.

A pin-on-plate type reciprocal sliding friction tester shown in FIG. 4 was used as the first friction tester 41. A $ZrO_2$ (YSZ) ball having a diameter of 4.8 mm and subjected to heat treatment at 200° C. in the atmosphere for 24 hours was used as a pin test piece 44 to be tested. A weight 71 was put on the pin test piece 44 to be tested, and the weight of the weight 71 was changed so that a load applied to the pin test piece 44 could be changed.

The first friction tester 41 is, for example, provided with a cylindrical chamber 45, and the pin test piece 44 is received in the chamber 45. The chamber 45 includes an acrylic chamber body 46 having a bottomed cylindrical shape, and an acrylic cover 47 closing the top of the chamber body 46. A long opening 48 long in a sliding direction of the pin test piece 44 is formed in the cover 47, and the pin test piece 44 is placed in the opening 48. A holding base 49 for holding the plate test piece 42 is disposed in a bottom portion of the chamber 45. A gas introduction pipe 51 is provided to penetrate a circumferential wall 50 of the chamber body 46. A first line 52 and a second line 53 are connected to the gas introduction pipe 51. Hydrogen gas is supplied through the first line 52, and hydrogen gas containing gaseous alcohol and gaseous steam is supplied through the second line 53. A first valve 54, a first flow rate regulating valve 55, and a first flowmeter 56 are placed in the first line 52. The first line 52 is opened/closed by the first valve 54. The flow rate of the hydrogen gas in the first line 52 is regulated by the first flow rate regulating valve 55. The flow rate of the hydrogen gas in the first line 52 is detected by the first flowmeter 56. A second valve 57, a second flow rate regulating valve 58, a second flowmeter 59, and an alcohol/water vessel 60 are placed in the second line 53. The second line 53 is opened/closed by the second valve 57. The flow rate of the hydrogen gas in the second line 53 is regulated by the second flow rate regulating valve 58. The flow rate of the hydrogen gas in the second line 53 is detected by the second flowmeter 59. Alcohol and water are stored in the alcohol/water vessel 60. The temperature of the alcohol/water vessel 60 is set at 20° C.±5° C. In the alcohol/water vessel 60, alcohol and water exist as a solution of liquid alcohol and liquid water, and gaseous alcohol and gaseous steam vaporized from the solution. When the second valve 57 is opened, hydrogen gas flows through the second line 53, and the hydrogen gas is supplied to the alcohol/water vessel 60. When the hydrogen gas circulates inside the alcohol/water vessel 60 where alcohol and water are stored, gaseous alcohol and gaseous steam are conveyed by the hydrogen gas to thereby reach the gas introduction pipe 51. Then, when the second valve 57 is opened and the first valve 54 is opened, the hydrogen gas containing the gaseous alcohol and the gaseous steam is supplied into the chamber 45 through the gas introduction pipe 51. The chamber 45 is provided so that the atmosphere in the chamber 45 can be controlled.

As shown in FIG. 5A, a silicon substrate 61 having the two-layered film 43 formed in its surface was used in the plate test piece 42. The two-layered film 43 was a hard carbon based film having a two-layered structure. An Si-DLC film 62 was on the lower layer side of the two-layered film 43. An PLC (Polymer-Like-Carbon) film 63 was on the upper layer side of the two-layered film 43. The Si-DLC film 62 was formed by an ionization vapor deposition method (PVD method) using raw material gas in which toluene and trimethylsilane ($Si(CH_3)_4$) were mixed at a gas flow rate of 2:3. The PLC film 63 was formed by an ionization vapor deposition method using only toluene as raw material gas. A bias voltage for forming the PLC film was set at −0.4 kV (low bias voltage).

FIG. 5B shows deposition pressure (Pa) during film formation, bias voltage (kV) during the film formation, treatment temperature (K) during the film formation, film thickness (nm), fine indentation hardness (GPa), Young's modulus (GPa), G-peak position ($cm^{-1}$) in a Raman spectrum, G-peak half value width (FWHM(G), $cm^{-1}$) in the Raman spectrum, intensity ratio (I(D)/I(G)) between D-peak and G-peak in the Raman spectrum, and estimated hydrogen concentration (at. %) in each of the Si-DLC film 62 and the PLC film 63.

Figure 6:
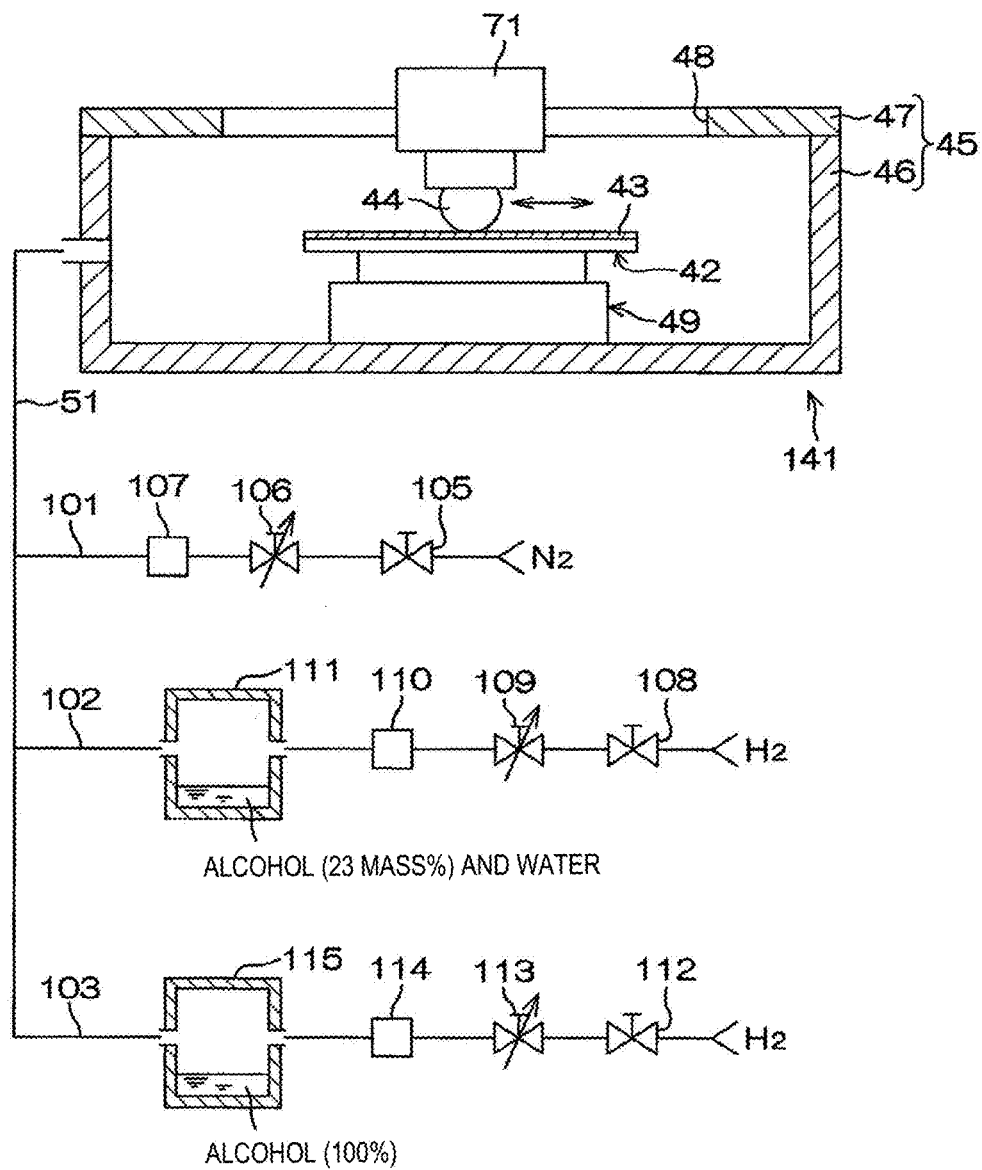
FIG. 6 is a schematic sectional view showing a configuration of a second friction tester.

FIG. 6 is a schematic sectional view showing a configuration of the second friction tester 141. Parts shared between the second friction tester 141 and the first friction tester 41 are referred in the same manner as in FIG. 4, and their description will be omitted. That is, the configuration of the chamber 45 in the second friction tester 141, the configuration of the pin test piece 44, etc. are equivalent to those in the first friction tester 41 without special description. The second friction tester 141 is different from the first friction tester 41 mainly at the point of its gas supply system.

A gas introduction pipe 51 of the gas supply system includes a third line 101, a fourth line 102, and a fifth line 103. Nitrogen gas is supplied through the third line 101. Hydrogen gas as carrier gas containing gaseous alcohol and gaseous steam is supplied through the fourth line 102.

Hydrogen gas as carrier gas containing gaseous alcohol but containing no gaseous steam is supplied through the fifth line 103.

A third valve 105, a third flow rate regulating valve 106, and a third flowmeter 107 are placed in the third line 101. The third line 101 is opened/closed by the third valve 105. The flow rate of nitrogen gas in the third line 101 is regulated by the third flow rate regulating valve 106. The flow rate of nitrogen gas in the third line 101 is detected by the third flowmeter 107.

A fourth valve 108, a fourth flow rate regulating valve 109, a fourth flowmeter 110, and an alcohol/water vessel 111 are placed in the fourth line 102. The fourth line 102 is opened/closed by the fourth valve 108. The flow rate of hydrogen gas in the fourth line 102 is regulated by the fourth flow rate regulating valve 109. The flow rate of hydrogen gas in the fourth line 102 is detected by the fourth flowmeter 110. Gaseous alcohol and gaseous steam are present in the alcohol/water vessel 111. The temperature in the alcohol/water vessel 111 is set at 20° C.±5° C. In the alcohol/water vessel 111, alcohol and water exist as a solution of liquid alcohol and liquid water, and gaseous alcohol and gaseous steam vaporized from the solution. In the alcohol/water vessel 111, liquid alcohol and liquid water are mixed at a volume ratio of 3:10. "Ethanol and water" contained in treatment gas flowing through the fourth line 102 contains gaseous ethanol and gaseous steam vaporized from the solution in which liquid ethanol and liquid water are mixed at the volume ratio 3:10 in which 3 designates the volume of the liquid ethanol alone which has not been mixed yet and 10 designates the volume of the liquid water alone which has not been mixed yet. The treatment gas obtained thus may be hereinafter referred to as "hydrogen gas (23%@) containing ethanol generated from a solution of 23 vol % ethanol concentration". Alternatively, in the alcohol/water vessel 111, liquid alcohol and liquid water may be mixed at a volume ratio of 1:4. "Ethanol and water" contained in treatment gas flowing through the fourth line 102 contains gaseous ethanol and gaseous steam vaporized from the solution in which liquid ethanol and liquid water are mixed at the volume ratio 1:4 in which 1 designates the volume of the liquid ethanol alone which has not been mixed yet and 4 designates the volume of the liquid water alone which has not been mixed yet. The treatment gas obtained thus may be hereinafter referred to as "hydrogen gas (20%@) containing ethanol generated from a solution of 20 vol % ethanol concentration".

A fifth valve 112, a fifth flow rate regulating valve 113, a fifth flowmeter 114, and an alcohol vessel 115 are placed in the fifth line 103. The fifth line 103 is opened/closed by the fifth valve 112. The flow rate of hydrogen gas in the fifth line 103 is regulated by the fifth flow rate regulating valve 113. The flow rate of hydrogen gas in the fifth line 103 is detected by the fifth flowmeter 114. Gaseous alcohol is present in the alcohol vessel 115 where only liquid alcohol (ethanol) is stored. The alcohol vessel 115 has no water but moisture that cannot be eliminated from ethanol. Accordingly, treatment gas flowing through the fifth line 103 substantially contains no water but contains gaseous ethanol. The treatment gas obtained thus may be hereinafter referred to as "hydrogen gas (100%@) containing ethanol generated from a solution of 100 vol % ethanol concentration".

When the third valve 105 is changed over between opening and closing, nitrogen as a main flow can be changed over between supply and supply stop. In addition, when at least one of the fourth and fifth valves 108 and 112 is opened, the component ratio between alcohol and water contained in the atmosphere inside the chamber 45 can be controlled. When the opening degrees of the flow rate regulating valves 109 and 113 are adjusted in addition to the opening of the valves 108 and 112, the component ratio between alcohol and water contained in the atmosphere inside the chamber 45 can be controlled more finely.

First and second friction tests will be described.

The plate test piece 42 was set in the first friction tester 41 so that the surface where the two-layered film 43 was formed could be used as a surface to be tested. The following first and second friction tests (high load tests repeated up to 28,200 times) were performed to investigate a generation state of FFO while increasing the magnitude of a load applied to the surface of the plate test piece 42 through the pin test piece 44 stepwise by units of 1.96N within a range of from 19.6 N to 58.8 N under test conditions that the frictional speed was 8.0 mm/s, the frictional stroke was 4.0 mm, the flow rate of gas supplied to the chamber 45 was about 2.0 to 2.5 (liters/minute), and lubrication was absent.

<First Friction Test>

In the first friction test, supplying hydrogen gas (hydrogen gas containing alcohol and water) from the second line 53 had been stopped. That is, only the hydrogen gas was used as supply gas to the chamber 45. The temperature inside the chamber 45 was set at 20° C.±5° C., and the humidity inside the chamber 45 was controlled by 0.1 to 0.3% RH. As shown by the broken line in FIG. 4, a bottomed vessel 72 made of polyethylene terephthalate (PET) was disposed in a bottom portion of the chamber 45, and waste cloth containing water was stored in the bottomed vessel 72. The bottomed vessel 72 was fixed to the bottom portion of the chamber 45 through a tape 73 (such as a double-sided tape) whose adhesive surfaces had been coated with acrylic ester as adhesive agent. Thus, the atmosphere inside the chamber 45 contained ethanol obtained from the acrylic ester by hydrolysis.

<Second Friction Test>

The temperature inside the chamber 45 was set at 20° C.±5° C. Hydrogen gas containing alcohol and water was used as supply gas to the chamber 45. As for the mixing ratio of the alcohol, vol % concentration of liquid alcohol which has not been mixed yet to the total volume of the volume of the liquid alcohol which has not been mixed yet and the volume of liquid water which has not been mixed yet was 6.3 to 1.7%.

Figure 7A:
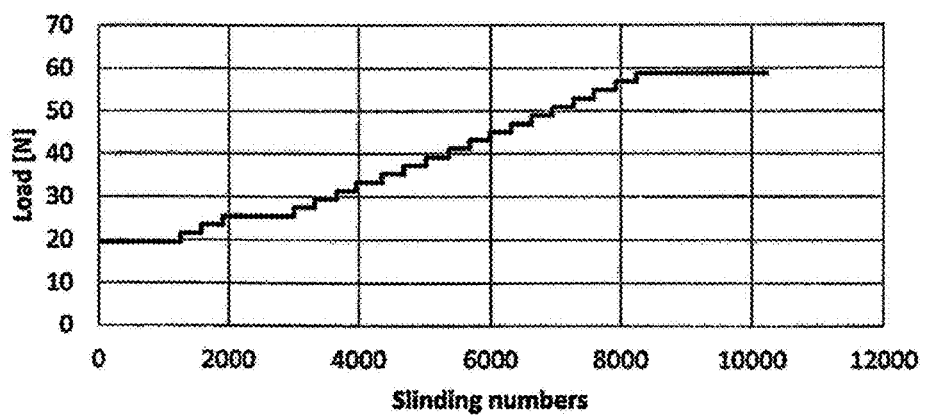
FIGS. 7A and 7B are graphs showing a relation between an applied load and a friction coefficient in the first friction test.
Figure 7B:
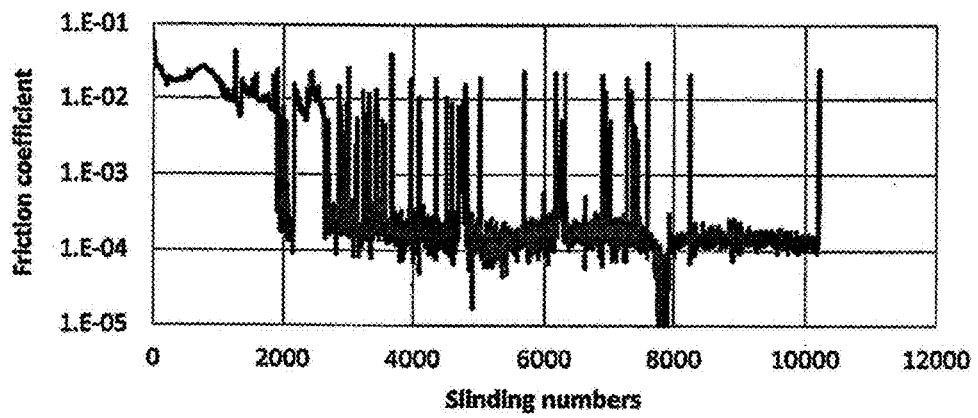

FIG. 7A is a graph showing an applied load in the first friction test, and FIG. 7B is a graph showing a measured value of a friction coefficient in the first friction test.

In the first friction test, the value of the friction coefficient was comparatively high (0.01 to 0.03) under the condition that the applied load was 19.6 N to 25.5 N. When the applied load reached 27.4 N, FFO (Friction-Fade-Out state) with a friction coefficient of $10^{-4}$ order was generated. The friction coefficient during the generation of FFO showed a value below $3 \times 10^{-4}$. However, even when the load was increased after that, the generation state of FFO was not stabilized, but increase and decrease in friction coefficient was repeated. FFO was generated comparatively stably under the condition that the applied load was 58.8 N.

The fact that such an FFO below $10^{-4}$ is generated in a state where liquid lubricant is absent can be regarded as an abnormal phenomenon.

FIG. 8A is a graph showing an applied load in the second friction test, and FIG. 8B is a graph showing a measured value of a friction coefficient in the second friction test.

In the second friction test, FFO was generated under the condition that the applied load was not lower than 47.1 N.

The friction coefficient at that time was about 0.0002. In the second friction test, a tendency to generate a stable FFO phenomenon was observed, as compared with the first friction test. In addition, in the second friction test, a tendency for the friction coefficient to decrease gradually with increase in applied load was observed, slightly differently from the case of the first friction test.

Next, third and fourth friction tests will be described. FIG. 9 is a table for explaining an upper layer of the plate test piece 42 to be measured in each of third and fourth friction tests. FIGS. 10A and 10B are tables for explaining test conditions of the third and fourth friction tests.

Each plate test piece 42 to be measured in the third and fourth friction tests has a two-layered film 43 on its front surface side. The two-layered film 43 is made of a hard carbon based film having a two-layered structure. In the third and fourth friction tests, of the two-layered film 43, an Si-DLC film forming a lower layer has an equivalent configuration to that of the Si-DLC film 62 (see FIG. 5A). On the other hand, of the two-layered film 43, an PLC (Polymer-Like-Carbon) film 163 forming an upper layer (surface layer) is produced in a manner partially different from that of the PLC film 63 (see FIG. 5A).

The production manner of the PLC film 163 is different from the production manner of the PLC film 63 mainly at the point that a high bias voltage (−4.0 kV) is used as a bias voltage in an ionization vapor deposition method (PVD method). The PLC film 163 provided in such a manner is an PLC film (high-bias deposited PLC) containing a comparatively large amount of a graphite component, as compared with the PLC film 63. In this embodiment, hydrogen is also added to the film (hydrogenated high-bias deposited PLC).

The plate test piece 42 was set in the second friction tester 141 so that the surface where the two-layered film 43 was formed could be used as a surface to be tested. The third and fourth friction tests (high load tests repeated up to 28,200 times) were performed to investigate a generation state of FFO while increasing the magnitude of a load applied to the surface of the plate test piece 42 through the pin test piece 44 stepwise by units of 1.96N within a range of from 19.6 N to 63.7 N under test conditions that the frictional speed was 8.0 mm/s, the frictional stroke was 4.0 mm, and lubrication was absent.

FIGS. 10A and 10B are tables for explaining test conditions of the third and fourth friction tests.

In each of the third and fourth friction tests, without distinction of a run-in environment between start of the test and generation of FFO and an FFO environment after the generation of FFO, nitrogen gas was supplied into the chamber 45 at a high flow rate (5.0 slm) as a main flow. The temperature inside the chamber 45 was set at 20° C.±5° C.

In the run-in environment in the third friction test, as sub-flows into the chamber 45, hydrogen gas (23%@) containing ethanol generated from a solution of 23 vol % ethanol concentration was supplied at a middle flow rate (180 sccm), and hydrogen gas (100%@) containing ethanol generated from a solution of 100 vol % ethanol concentration was supplied at a very low flow rate (5 sccm).

In addition, in the FFO environment in which FFO was generated in the third friction test, the atmosphere inside the chamber 45 was controlled to be lower in ethanol concentration and water concentration than in the run-in environment. A method for controlling the ethanol concentration and the water concentration to be low is effective to generate FFO. Specifically, as sub-flows into the chamber 45, hydrogen gas (23%@) containing ethanol generated from a solution of 23 vol % ethanol concentration was supplied at a low flow rate, and hydrogen gas (100%@) containing ethanol generated from a solution of 100 vol % ethanol concentration was supplied at a very low flow rate. Specifically, the supply flow rate of the hydrogen gas (23%@) containing ethanol generated from the solution of 23 vol % ethanol concentration was set at 40 sccm in the beginning of the supply, and then reduced to 20 sccm. On the other hand, the supply flow rate of the hydrogen gas (100%@) containing ethanol generated from the solution of 100 vol % ethanol concentration was set at 5 sccm in the beginning of the supply, and then reduced to 1 sccm.

In the run-in environment in the fourth friction test, as a sub-flow into the chamber 45, hydrogen gas (20%@) containing ethanol generated from a solution of 20 vol % ethanol concentration was supplied at a middle flow rate (180 sccm).

In addition, in the FFO environment in the fourth friction test, as a sub-flow into the chamber 45, hydrogen gas (20%@) containing ethanol generated from a solution of 20 vol % ethanol concentration was supplied at a low flow rate. Specifically, the supply flow rate of the hydrogen gas (20%@) containing ethanol generated from the solution of 20 vol % ethanol concentration was set at 40 sccm in the beginning of the supply, and then reduced to 30 sccm.

Figure 11:
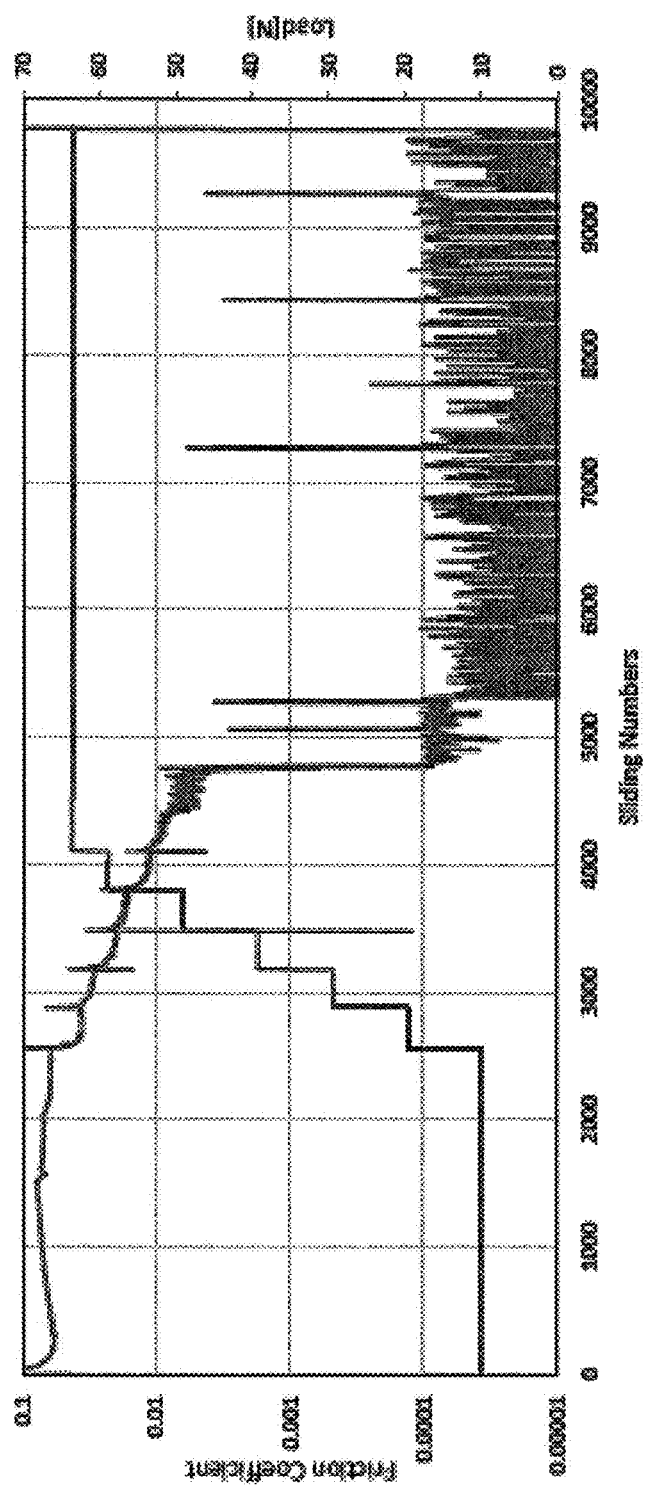
FIG. 11 is a graph showing a relation between an applied load and a friction coefficient in the third friction test.

FIG. 11 is a graph showing a relation between an applied load and a measured value of a friction coefficient in the third friction test.

In the third friction test, as shown in FIG. 11, the load was increased stepwise to 63.7 N, and the load was kept at 63.7 N after reaching 63.7 N. On and after the time (sliding number of about 4,700 times) when the supply flow rate of the hydrogen gas (23%@) containing ethanol generated from the solution of 23 vol % ethanol concentration was decreased from 60 sccm to 40 sccm, the friction coefficient dropped down suddenly, and FFO was generated. On and after the time (sliding number of about 5,300 times) when the supply flow rate of the hydrogen gas (23%@) containing ethanol generated from the solution of 23 vol % ethanol concentration was decreased to 30 sccm, stable FFO with the friction coefficient of not higher than $1 \times 10^{-4}$ was generated. The value of the friction coefficient of not higher than $1 \times 10^{-4}$ was a noise level (1 mN) in the friction force measuring system. After that, the generation of FFO was kept up to a predetermined time when the sliding number was about 9,600 times. The generation time of FFO was about 49 minutes. Incidentally, the supply flow rate of the hydrogen gas (23%@) containing ethanol generated from the solution of 23 vol % ethanol concentration was decreased to 30 sccm at the time when the sliding number was about 5,300 times, and to 20 sccm at the time when the sliding number was about 9,300 times.

Figure 12:
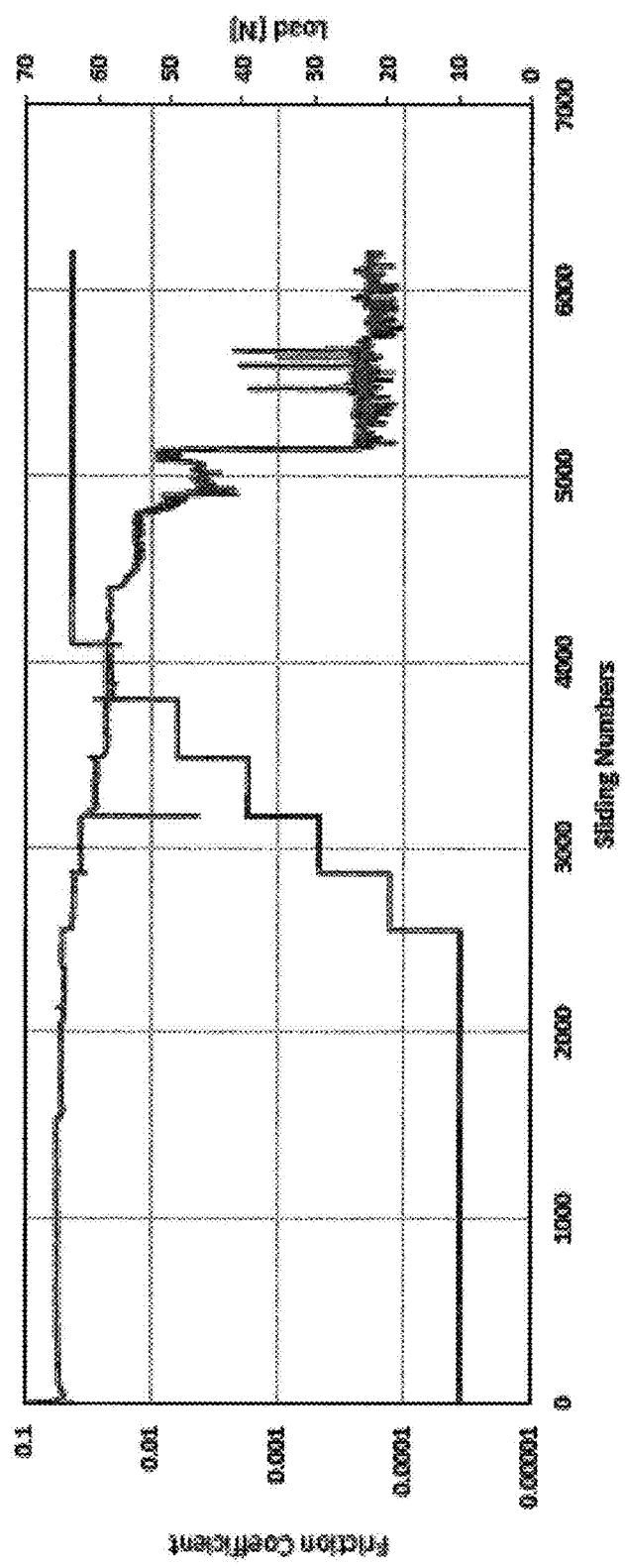
FIG. 12 is a graph showing a relation between an applied load and a friction coefficient in the fourth friction test.

FIG. 12 is a graph showing a relation between an applied load and a measured value of a friction coefficient in the fourth friction test.

In the fourth friction test, as shown in FIG. 12, the load was increased stepwise to 63.7 N, and the load was kept at 63.7 N after reaching 63.7 N. On and after the time (sliding number of about 5,200 times) when the supply flow rate of the hydrogen gas (20%@) containing ethanol generated from the solution of 20 vol % ethanol concentration was decreased from 60 sccm to 40 sccm, the friction coefficient dropped down suddenly, and FFO was generated. On and after the time (sliding number of about 5,700 times) when the supply flow rate of the hydrogen gas (20%@) containing ethanol generated from the solution of 20 vol % ethanol concentration was decreased to 30 sccm, the friction coefficient was decreased. After the generation of FFO was continued for about 10 minutes, the friction test was terminated. Momentary increase in friction coefficient was observed several times during the generation of FFO. However, the friction coefficient during the generation of FFO was generally stable at $2\times10^{-4}$ on and after the time (sliding number of about 5,700 times) when the supply flow rate of the hydrogen gas (20%@) containing ethanol generated from the solution of 20 vol % ethanol concentration was decreased to 30 sccm.

<Measurement of Surface State>

The surface state of the external surface of the pin test piece 44 after the termination of each of the first to fourth friction tests was measured by a white light interference type shape measuring machine (NewView 5022 made by Zygo Corporation).

Figure 13A:
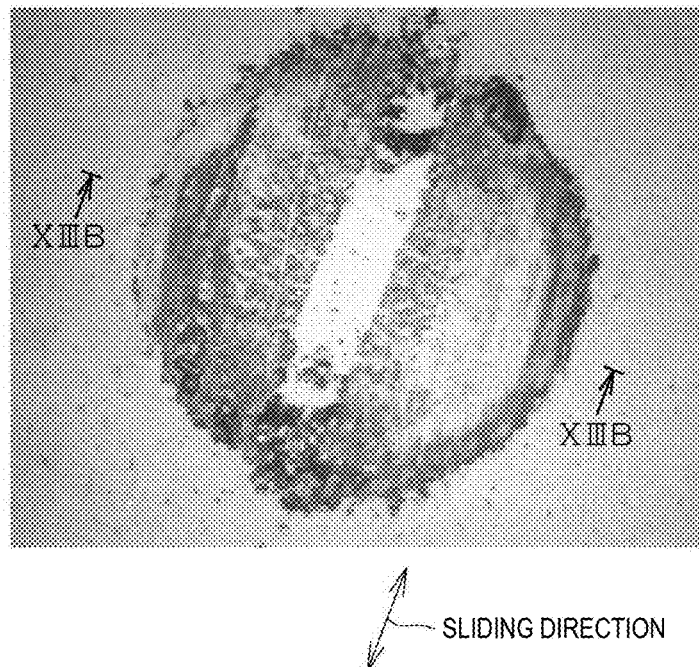
FIGS. 13A and 13B are an image and a graph showing a surface state of an external surface (a sliding region thereof) of a pin test piece after the first friction test.
Figure 13B:
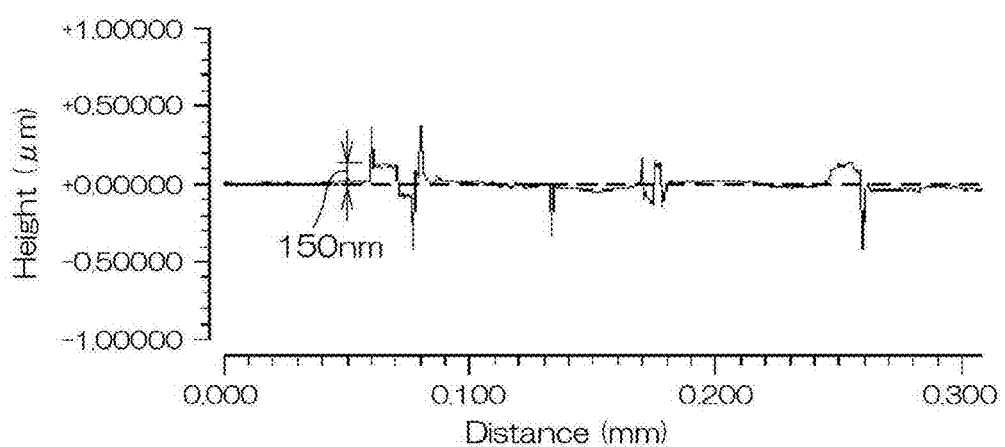
Figure 14A:
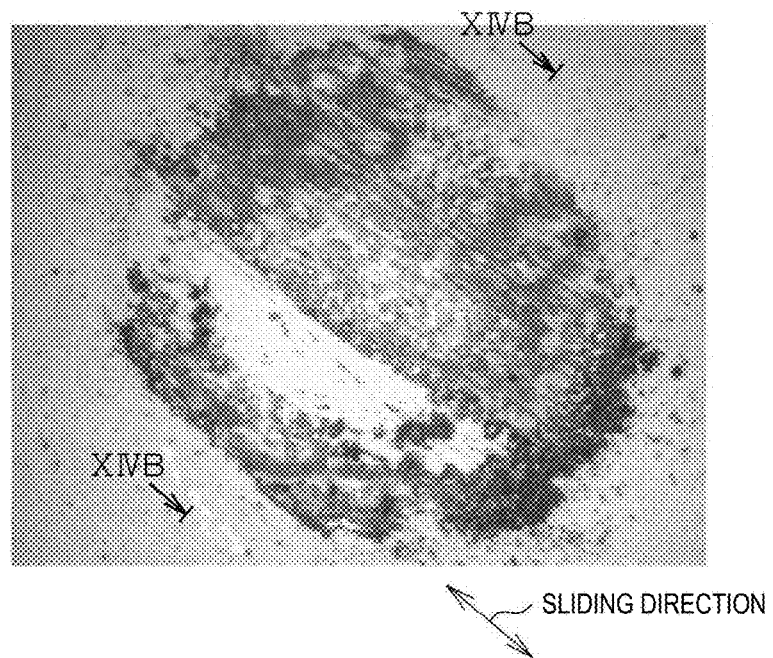
FIGS. 14A and 14B are an image and a graph showing a surface state of an external surface (a sliding region thereof) of a pin test piece after the second friction test.
Figure 14B:
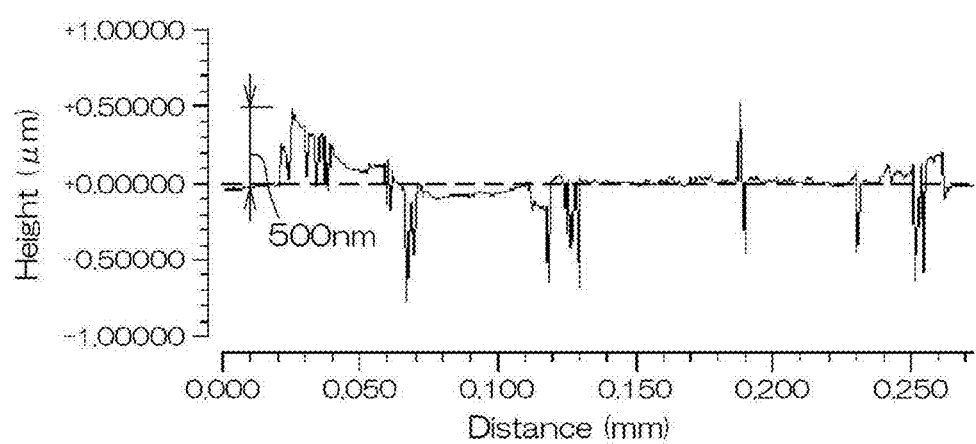
Figure 15:
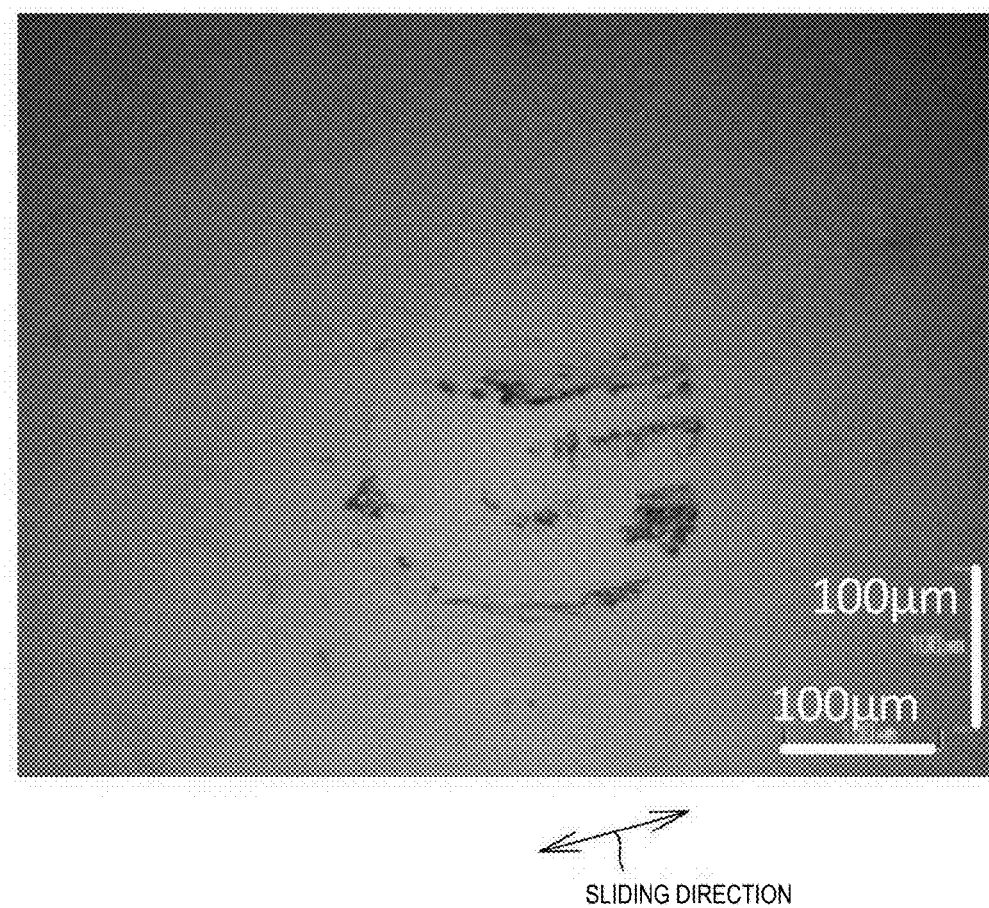
FIG. 15 is an image of an optical microscope photograph showing an external surface (a sliding region thereof) of a pin test piece after the third friction test.
Figure 16:
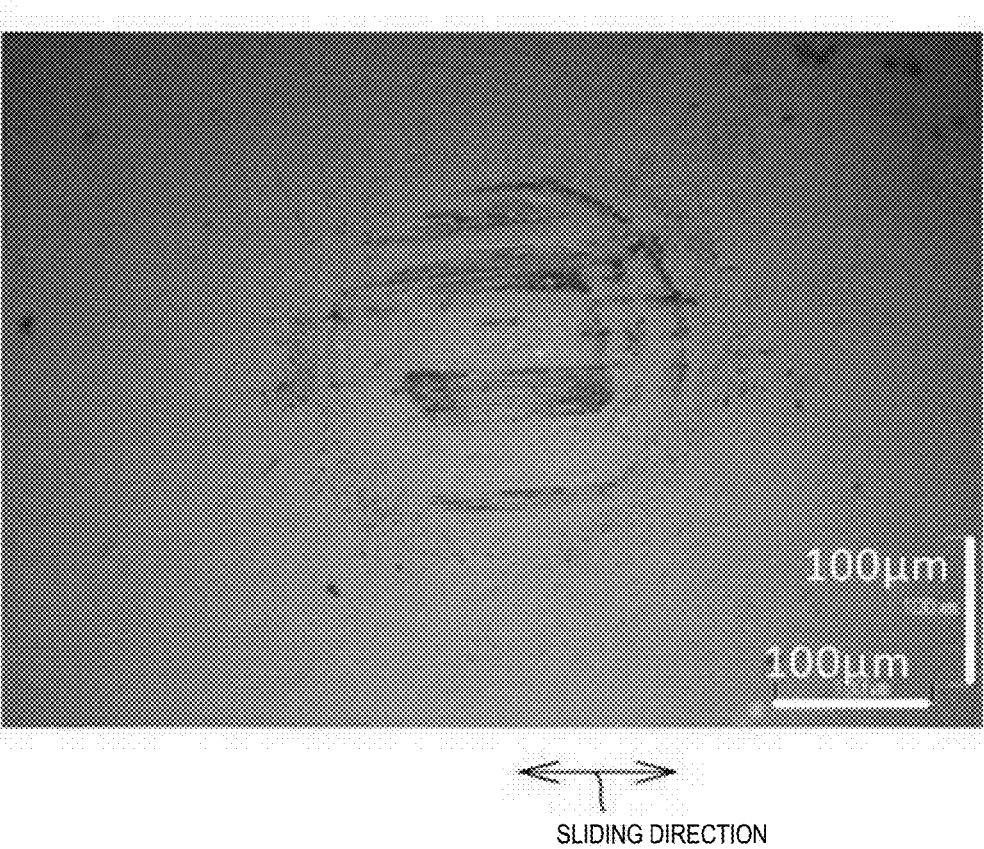
FIG. 16 is an image of an optical microscope photograph showing an external surface (a sliding region thereof) of a pin test piece after the fourth friction test.

FIG. 13 are an image and a graph showing the surface state of the external surface (sliding region thereof) of the pin test piece 44 after the first friction test. FIG. 14 are an image and a graph showing the surface state of the external surface (sliding region thereof) of the pin test piece 44 after the second friction test. Each of FIG. 13A and FIG. 14A is an image of an optical microscope photograph of the external surface of the pin test piece 44. FIG. 13B shows a distribution of surface height in the external surface of the pin test piece 44, which is cut along line XIIIB-XIIIB in FIG. 13A. FIG. 14B shows a distribution of surface height in the external surface of the pin test piece 44, which is cut along line XIVB-XIVB in FIG. 14A. FIG. 15 is an image of an optical microscope photograph showing the external surface (sliding region thereof) of the pin test piece 44 after the third friction test. FIG. 16 is an image of an optical microscope photograph showing the external surface (sliding region thereof) of the pin test piece 44 after the fourth friction test.

After the termination of each of the first and second friction tests, a transparent film-like product is attached to (formed in) a circular sliding region (corresponding to a Heltzian contact surface) of the external surface of the pin test piece 44. The thickness of the product formed after the first friction test is about several nm to about 150 nm. The thickness of the product formed after the second friction test is about 10 nm to about 500 nm. Those products can be scraped from the surfaces by a spatula or the like. That is, the products can be regarded as softer than a hard carbon based film such as a DLC.

In the sliding state between the pin test piece 44 and the PLC 63, it can be considered that such a film-like product is formed on the external surface of the pin test piece 44, and the product slides against the PLC film 63 to thereby generate FFO. That is, it can be considered that the generation of FFO can be achieved due to the existence of the product.

<Analysis of First to Fourth Sliding Products>

Infrared spectroscopy was performed on a product on the external surface (sliding region thereof) of the pin test piece 44 in the first friction test (hereinafter referred to as "first sliding product"), a product on the external surface (sliding region thereof) of the pin test piece 44 in the second friction test (hereinafter referred to as "second sliding product"), and a product on the external surface (sliding region thereof) of the pin test piece 44 in the third friction test (hereinafter referred to as "third sliding product"). Of each product picked up on a diamond substrate from the external surface (sliding region thereof) of the pin test piece 44 by a metal probe, a measurement area about 20 μm square was analyzed by a microscope transmission method.

In addition, time-of-flight secondary ion mass spectrometry (TOF-SIMS) was also performed on the first to third sliding products. $Bi^+$ (30 keV, 1.4 pA) ions as primary ions were rastered over a 300 μm square area with 256×256 pixels by TOF-SIMS 5 made by ION-TOF Gmbh, and integrated 30 times.

Figure 17:
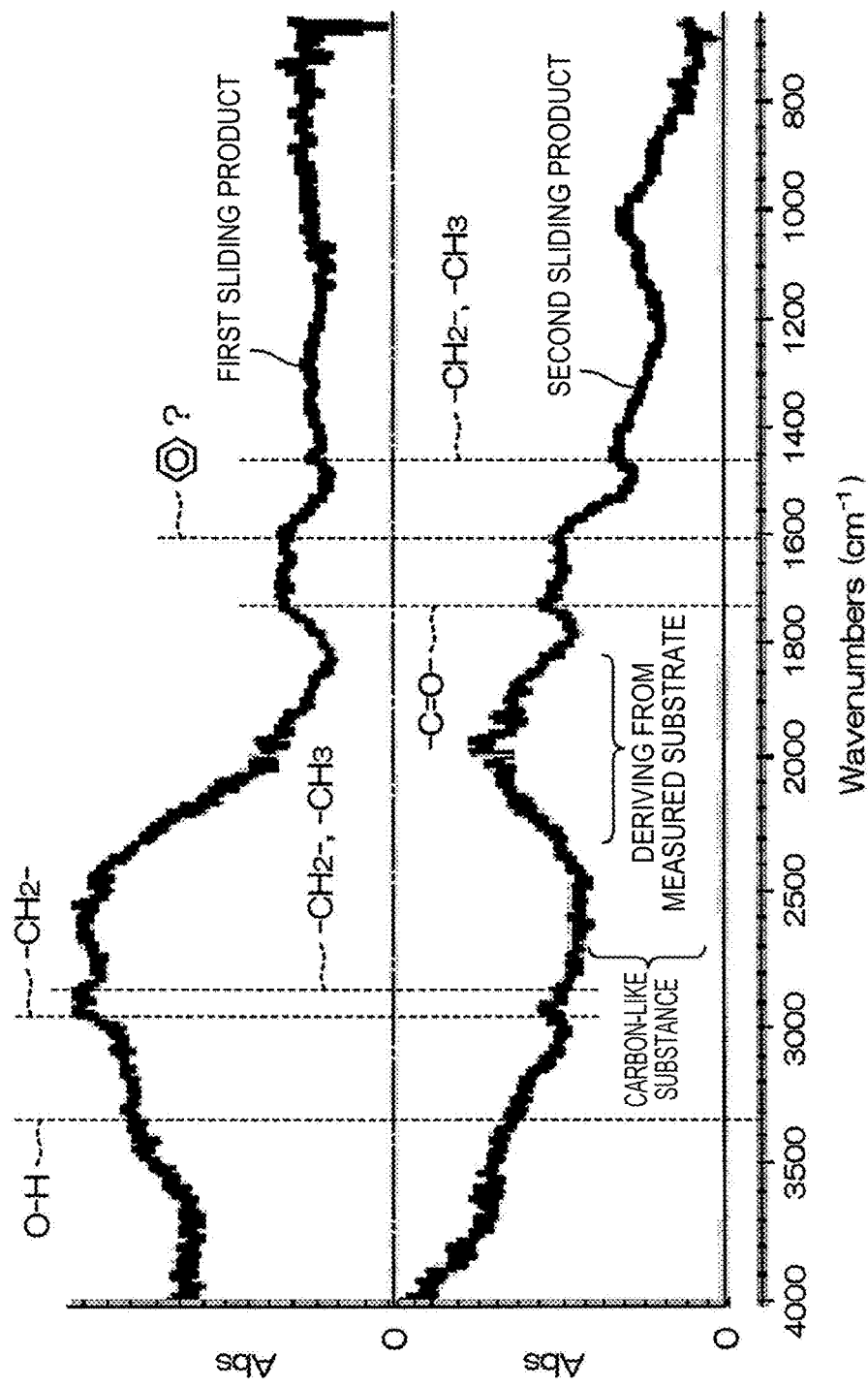
FIG. 17 is a graph showing an infrared absorption spectrum of each of first and second sliding products by a microscope transmission method.

FIG. 17 is a graph showing an infrared absorption spectrum of each of the first and second sliding products by a microscope transmission method. The infrared absorption spectrum of the first sliding product is shown in the upper part of FIG. 17, and the infrared absorption spectrum of the second sliding product is shown in the lower part of FIG. 17. In addition, the amount of the first sliding product picked up is so small that the spectrum of the first sliding product has an unclear part.

Figure 18:
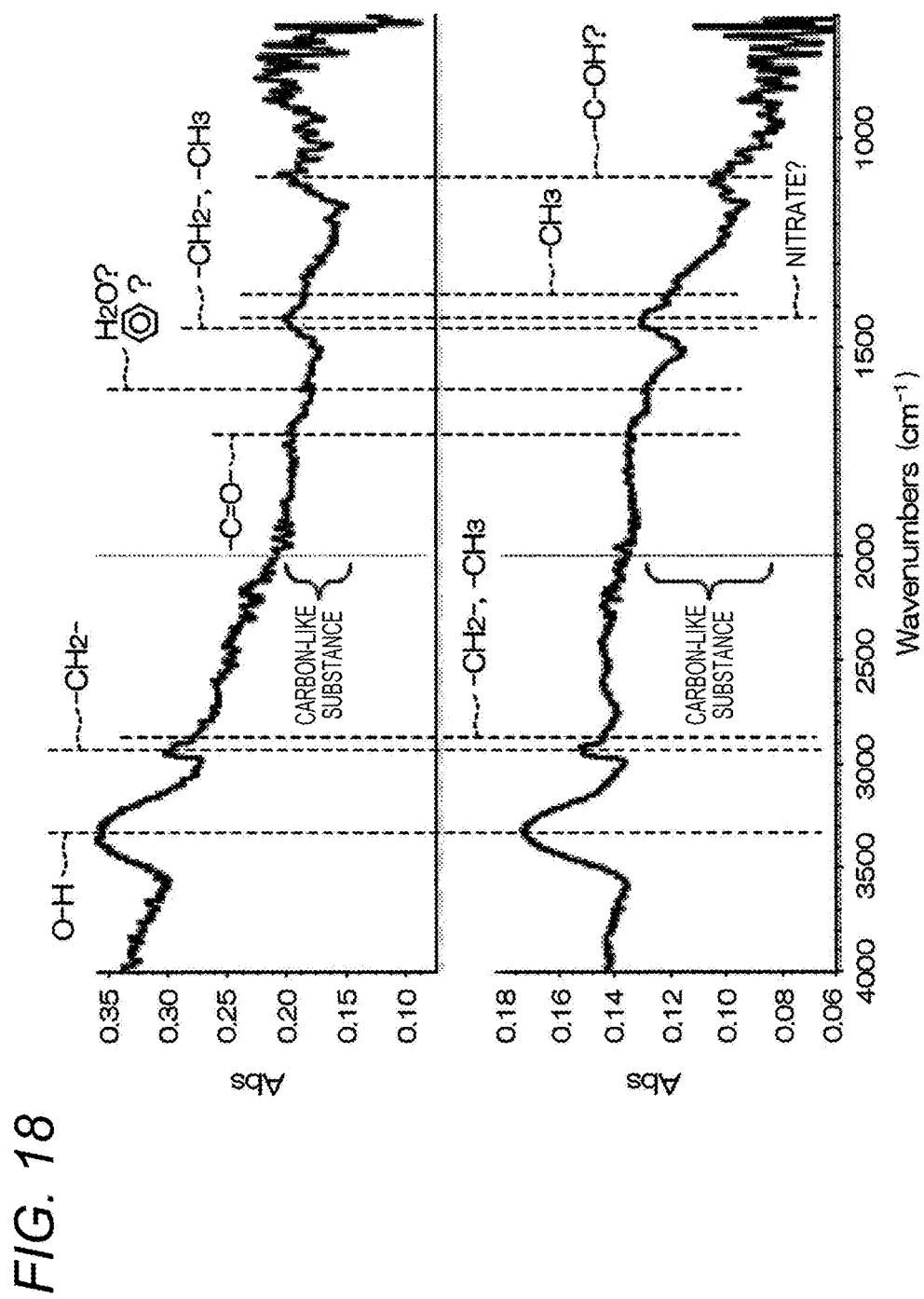
FIG. 18 is a graph showing an infrared absorption spectrum of each of third and fourth sliding products by a microscope transmission method.

According to FIG. 17 and FIG. 18, a peak can be recognized in a region near 2,900 $cm^{-1}$ to 3,000 $cm^{-1}$ in each of the first to fourth sliding products. It is estimated that this is a "C—H" bond peak which derives from an aliphatic hydrocarbon group such as a methylene group ($-CH_3$) or a methyl group ($-CH_2-$).

When attention is paid to a base line lying in a region of from 800 $cm^{-1}$ to 2,500 $cm^{-1}$, a tendency to fall to the right with increase in wavelength appears in both the first and second sliding products. It can be considered that such a tendency of the base line derives from a carbon-like substance. From a result of Raman analysis performed additionally, it is estimated that the carbon-like substance derives from an amorphous carbon based substance (amorphous carbon).

In the second sliding product, a peak can be recognized in a region near 1,720 $cm^{-1}$. It is estimated that this peak is a "—C(=O)—" bond peak, which derives from a carbonyl group. Also in the first sliding product, existence of a peak can be recognized in a region near 1,720 $cm^{-1}$. It is considered that the reason why the peak of the first sliding product is unclear is because the amount of the first sliding product picked up is small.

In addition, a peak can be recognized in a region near 1,600 $cm^{-1}$ in both the first and second sliding products. It can be considered that this peak is either a peak deriving from a benzene ring or a peak deriving from a lower carboxylate.

FIG. 18 is a graph showing an infrared absorption spectrum of each of the third and fourth sliding products by a microscope transmission method. The infrared absorption spectrum of the third sliding product is shown in the upper part of FIG. 18, and the infrared absorption spectrum of the fourth sliding product is shown in the lower part of FIG. 18.

In the same manner as in the first and second sliding products, a peak can be recognized in a region near 2,900 $cm^{-1}$ to 3,000 $cm^{-1}$ in each of the third and fourth sliding products. It is estimated that this peak is a "C—H" bond peak, which derives from an aliphatic hydrocarbon group such as a methylene group ($-CH_3$) or a methyl group ($-CH_2-$).

When attention is paid to a base line lying in a region of from 800 $cm^{-1}$ to 2,500 $cm^{-1}$, a tendency to fall to the right with increase in wavelength appears in both the third and fourth sliding products. It can be considered that such a tendency of the base line derives from a carbon-like substance (specifically, an amorphous carbon based substance (amorphous carbon)).

In FIG. 18, in both the third and fourth sliding products, a peak can be recognized in a region near 1,720 $cm^{-1}$. It is estimated that this peak is a "—C(=O)—" bond peak, which may derive from a carbonyl group. Incidentally, the peak in the region near 1,720 cm$^{-1}$ in FIG. 18 is not as clear as that in the second sliding product shown in FIG. 17.

In addition, in both the third and fourth sliding products, a peak can be recognized in a region near 1,600 cm$^{-1}$. It can be considered that this peak is either a peak deriving from a benzene ring or a peak deriving from water. Incidentally, the peak in the region near 1,600 cm$^{-1}$ in FIG. 18 is not as clear as that in the second sliding product shown in FIG. 17.

That is, it was proved that, whether either the PLC film 63 or the PLC film 163 produced under different conditions from each other was used as the upper layer of the plate test piece 42, or whether the major component of the friction atmosphere was either a reducible hydrogen atmosphere (the first friction test or the second friction test) or an inactive nitrogen atmosphere (the third friction test or the fourth friction test), a sliding product having at least one of an aliphatic hydrocarbon group and a carbonyl group was formed on the pin test piece 44 so that FFO could be generated in the sliding product.

Figure 19:
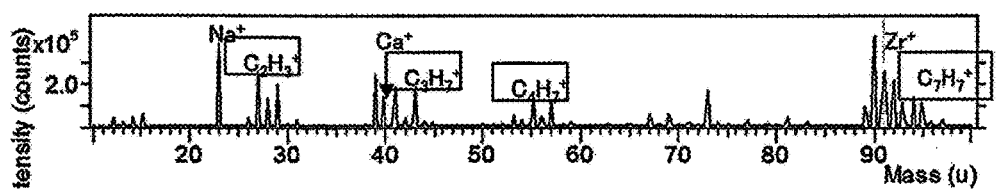
FIG. 19 is a graph showing a positive ion spectrum of the first sliding product obtained by TOF-SIMS.
Figure 19:
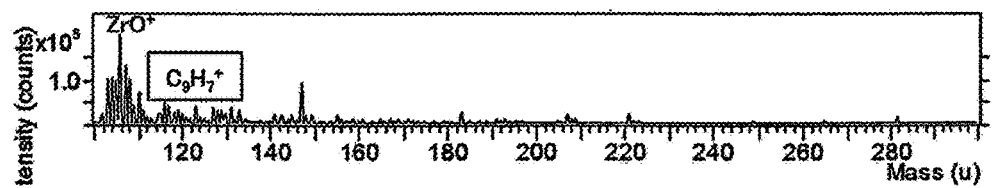
Figure 20:
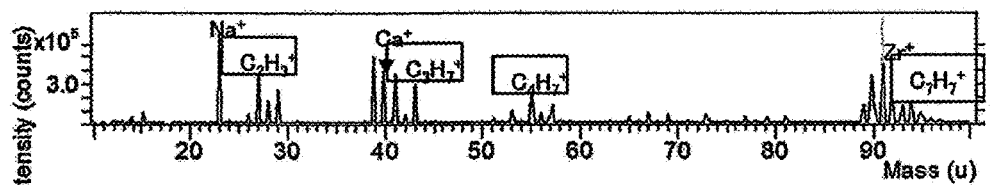
FIG. 20 is a graph showing a positive ion spectrum of the second sliding product obtained by TOF-SIMS.
Figure 20:
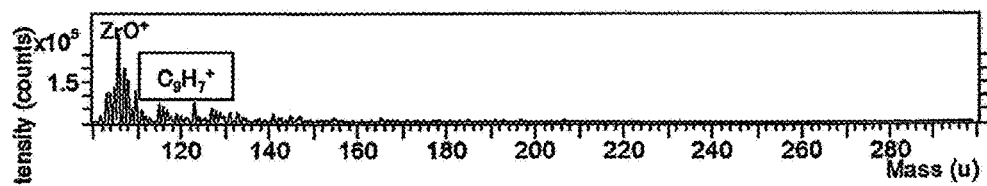
Figure 21:
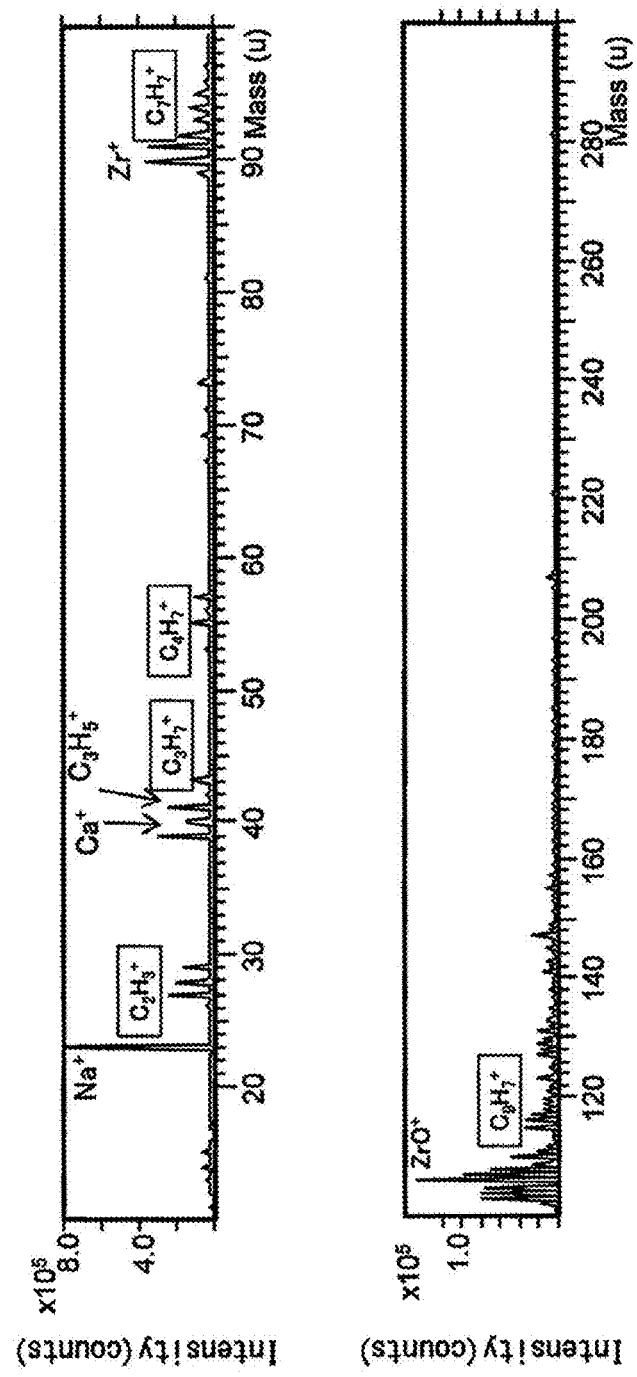
FIG. 21 is a graph showing a positive ion spectrum of the third sliding product obtained by TOF-SIMS.
Figure 22:
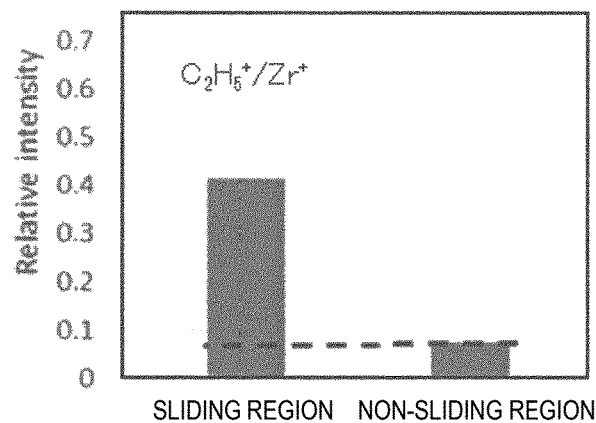
FIG. 22 is a graph showing a secondary ion intensity ratio of $C_2H_5^+$ relative to $Zr^+$ in the second sliding product.
Figure 23:
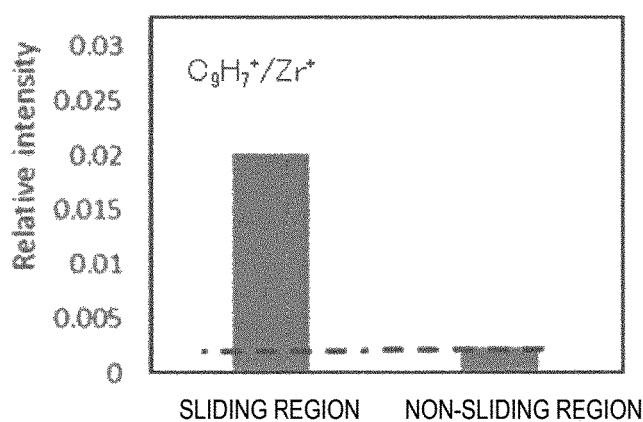
FIG. 23 is a graph showing a secondary ion intensity ratio of $C_9H_7^+$ relative to $Zr^+$ in the second sliding product.
Figure 24:
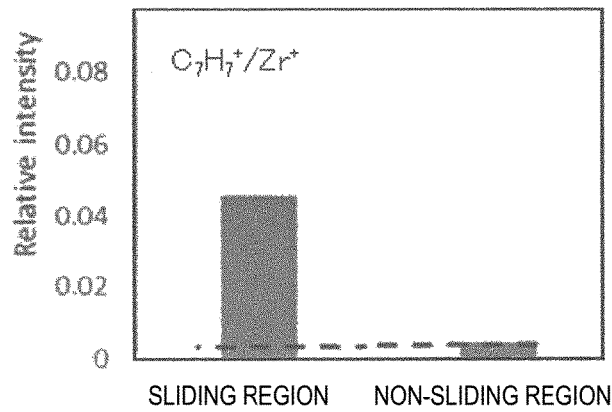
FIG. 24 is a graph showing a secondary ion intensity ratio of $C_7H_7^+$ relative to $Zr^+$ in the second sliding product.

FIG. 19 is a graph showing a positive ion spectrum of the first sliding product obtained by TOF-SIMS. FIG. 20 is a graph showing a positive ion spectrum of the second sliding product obtained by TOF-SIMS. FIG. 21 is a graph showing a positive ion spectrum of the third sliding product obtained by TOF-SIMS. FIG. 22 is a graph showing a secondary ion intensity ratio of $C_2H_5^+$ relative to $Zr^+$ in the second sliding product. FIG. 23 is a graph showing a secondary ion intensity ratio of $C_9H_7^+$ relative to $Zr^+$ in the second sliding product. FIG. 24 is a graph showing a secondary ion intensity ratio of $C_7H_7^+$ relative to $Zr^+$ in the second sliding product.

In the positive ion spectra of the first and second sliding products, as shown in FIG. 19 and FIG. 20, ions such as $C_2H_3^+$, $C_2H_5^+$ (mass: 29.06), $C_3H_7^+$, $C_4H_7^+$, $C_7H_7^+$ (mass: 91.13), $C_9H_7^+$ (mass: 115.15), etc. are detected much. It can be considered that, of those ions, $C_7H_7^+$ derives from an aromatic component. In addition, it can be considered that $C_9H_7^+$ derives from a condensed ring based component.

On the other hand, in the positive ion spectrum of the third sliding product, as shown in FIG. 21, ions such as $C_2H_3^+$, $C_2H_5^+$ (mass: 29.06), $C_3H_7^+$, $C_4H_7^+$, $C_7H_7^+$ (mass: 91.13), $C_9H_7^+$ (mass: 115.15), etc. are detected much. It can be considered that, of those ions, $C_7H_7^+$ derives from an aromatic component. In addition, it can be considered that $C_9H_7^+$ derives from a condensed ring based component.

That is, it was proved that, whether either the PLC film 63 or the PLC film 163 produced under different conditions from each other was used as the upper layer of the plate test piece 42, or whether the major component of the friction atmosphere was either a reducible hydrogen atmosphere (the first friction test or the second friction test) or an inactive nitrogen atmosphere (the third friction test or the fourth friction test), a sliding product including an aromatic component showing a peak at a mass of 91.1 in a positive ion spectrum obtained by TOF-SIMS and a reduced ring based component showing a peak at a mass of 115.2 in the positive ion spectrum obtained by TOF-SIMS was formed so that FFO could be generated in the sliding product.

Further, in order to quantitatively analyze $C_2H_5^+$, $C_9H_7^+$ and $C_7H_7^+$, a relative intensity ratio between each ion and a $Zr^+$ ion deriving from the material ($ZnO_2$) of the pin test piece 44 was examined as to the first and second sliding products. In FIGS. 22 to 24, each of the first and second sliding products, which is a product in the sliding region of the external surface of the pin test piece 44, is shown in comparison with a product in a non-sliding region of the external surface of the pin test piece 44.

From FIGS. 22 to 24, it is understood that as to each of $C_2H_5^+$, $C_9H_7^+$ and $C_7H_7^+$, more ions are generated in the sliding region than in the non-sliding region of the external surface of the pin test piece 44.

Figure 25:
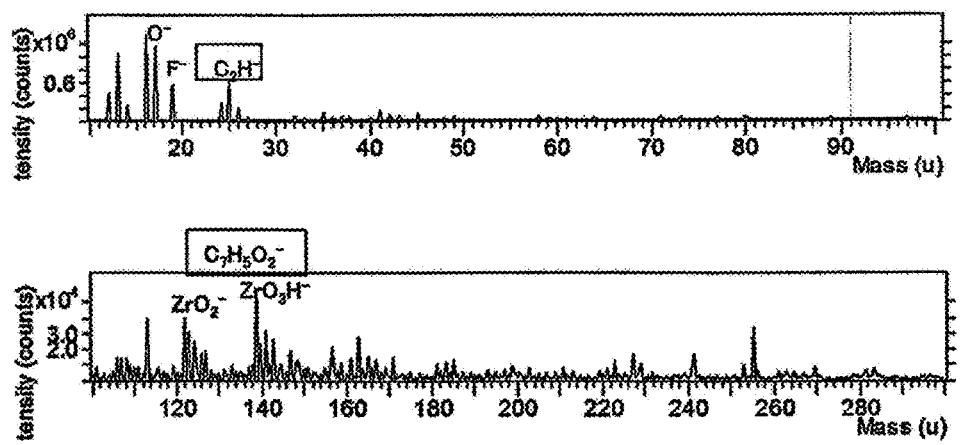
FIG. 25 is a graph showing a negative ion spectrum of the first sliding product obtained by TOF-SIMS.
Figure 26:
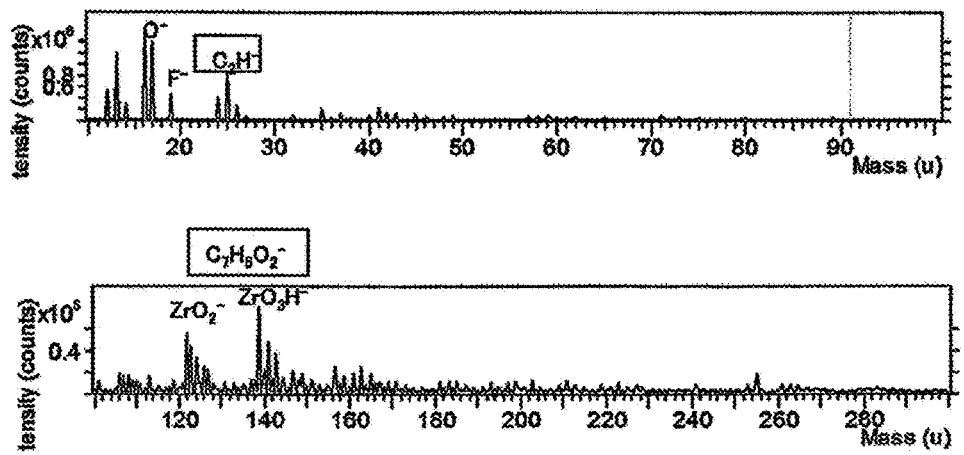
FIG. 26 is a graph showing a negative ion spectrum of the second sliding product obtained by TOF-SIMS.
Figure 27:
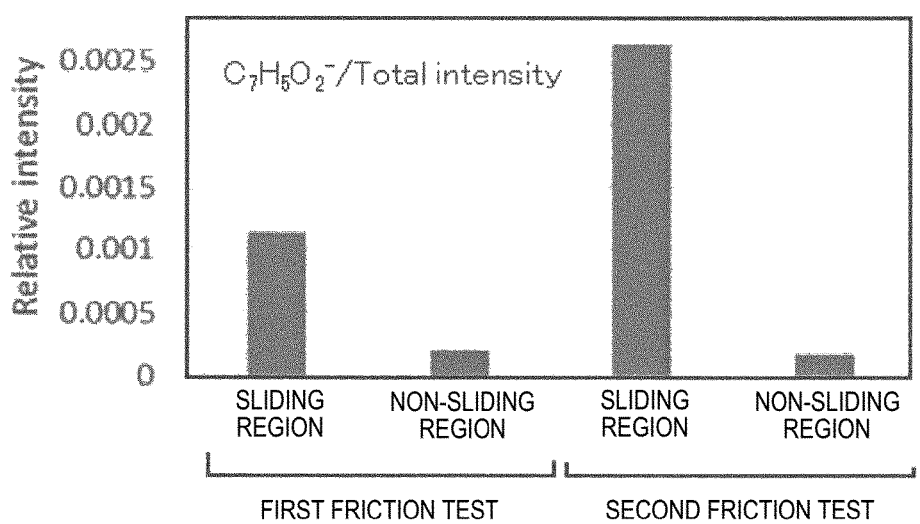
FIG. 27 is a graph showing a secondary ion intensity ratio of $C_7H_5O_2^-$ relative to negative ion total intensity in each of the first and second sliding products.

FIG. 25 is a graph showing a negative ion spectrum of the first sliding product obtained by TOF-SIMS. FIG. 26 is a graph showing a negative ion spectrum of the second sliding product obtained by TOF-SIMS. FIG. 27 is a graph showing a secondary ion intensity ratio of $C_7H_5O_2^-$ relative to negative ion total intensity in each of the first and second sliding products.

In the negative ion spectra of the first and second sliding products, as shown in FIGS. 25 and 26, lots of benzoic ions $C_7H_5O_2^-$ (mass: 121.12) having a benzene ring are detected. In addition, from FIG. 27, it is understood that more benzoic ions are generated in the sliding region than in the non-sliding region in the external surface of the pin test piece 44.

In addition, as described previously with reference to FIG. 17, in both the first and second sliding products, a peak can be recognized in a region near 1,600 cm$^{-1}$. When the results of FIGS. 25 to 27 are also referred to, it is understood that this peak is not a peak deriving from lower carboxylate but a peak deriving from a benzene ring.

Incidentally, as described later, $C_7H_5O_2^-$ is also detected from the surface of the PLC film 63. It can be considered that $C_7H_5O_2^-$ is a component caused by transfer/degeneration of the PLC film 63.

<Analysis of Surface of PLC Film 63>

The surface of the PLC film 63 before and after the second friction test was analyzed by a microscopic total reflection absorption (microscopic ATR) method using a germanium prism.

In addition, TOF-SIMS was also performed on the surface of the PLC film 63 after each of the first and second friction tests. Bi$^+$ (30 keV, 1.4 pA) ions as primary ions were rastered over a 300 μm square area with 256×256 pixels by TOF-SIMS 5 made by ION-TOF Gmbh, and integrated 30 times.

Figure 28:
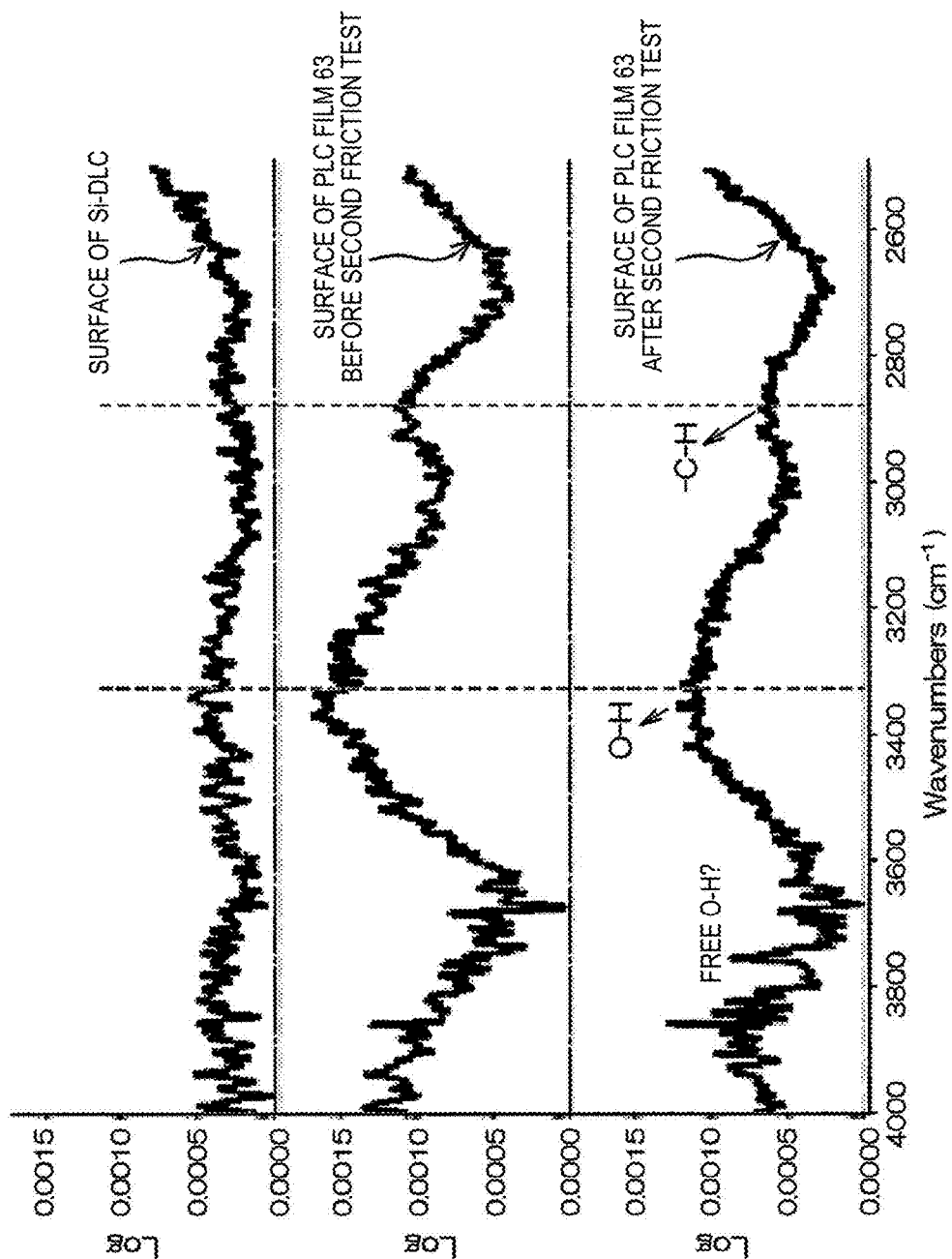
FIG. 28 is a graph (part 1) showing an infrared absorption spectrum of an PLC film after the second friction test by total reflection absorption (microscopic ATR) spectroscopy.
Figure 29:
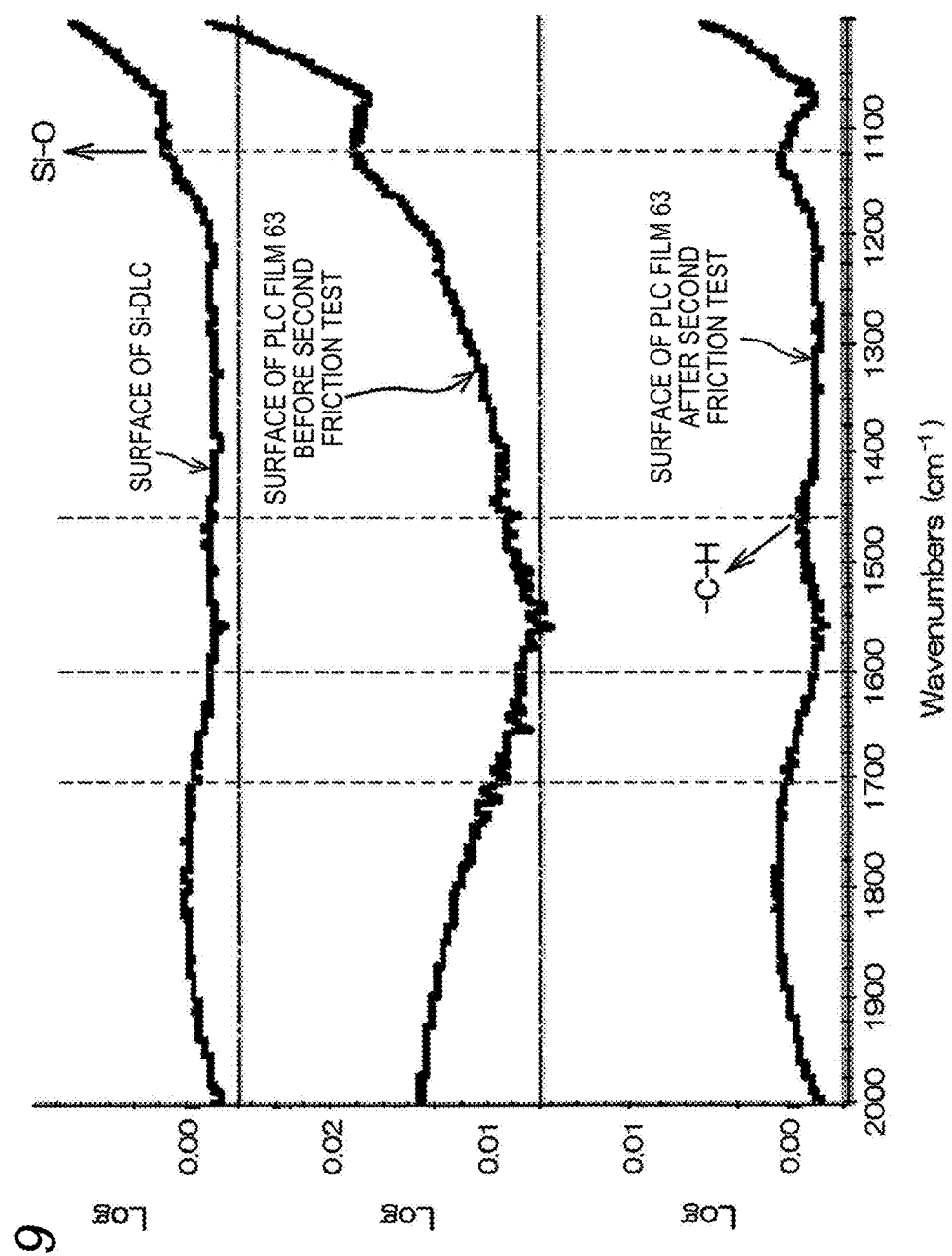
FIG. 29 is a graph (part 2) showing the infrared absorption spectrum of the PLC film after the second friction test by the microscopic ATR spectroscopy.

The infrared absorption spectrum of the second sliding product will be compared with the infrared absorption spectra of the PLC film 63 before and afore the second friction test. FIGS. 28 and 29 are graphs showing the infrared absorption spectra of the PLC film 63 before and after the second friction test by microscopic ATR spectroscopy. In each of FIGS. 28 and 29, the infrared absorption spectrum of the PLC film 63 after the second friction test is shown in the lower part of the drawing, the infrared absorption spectrum of the PLC film 63 before the second friction test is shown in the middle part of the drawing, and an infrared absorption spectrum of a surface of an Si-DLC is shown by reference in the upper part of the drawing.

According to FIG. 29, a peak deriving from a carbonyl group in a region of from near 1,650 cm$^{-1}$ to 1,800 cm$^{-1}$ (see FIG. 17, regarded as a peak deriving from a carbonyl group), which was recognized near 1,720 cm$^{-1}$ in the second sliding product, and a peak near 1,600 cm$^{-1}$ (see FIG. 17, regarded as a peak deriving from a benzene ring) could not be observed in the infrared absorption spectrum of the surface of the PLC film 63 after the second friction test. In addition, a peak near 1,720 cm$^{-1}$ and a peak near 1,600 cm$^{-1}$ could not be observed in the spectrum of the surface of the PLC film 63 before the friction test as shown in FIG. 29. Since the peak derived from a carbonyl group and appearing in a region of from 1,650 cm$^{-1}$ to 1,800 cm$^{-1}$, which was observed in the second sliding product as shown in FIG. 17, and the peak near 1,600 cm$^{-1}$ could not be detected from the PLC film 63 either before or after the second friction test. Therefore, it is estimated that the second sliding product was not a product simply transferred to the PLC film 63 but was a compound newly produced from a transferred substance, atmosphere gas, etc. by further tribochemical reaction.

In addition, pay attention to a region near 3,800 cm$^{-1}$ to 3,000 cm$^{-1}$ in the surface of the PLC film 63 after the second friction test. The existence of a peak deriving from a free O—H group (hydroxyl group), and the existence of a peak deriving from an O—H group can be recognized. It can be also considered that shearing force may be reduced by sliding against the surface of a sliding partner because the free O—H group where molecules are apt to move is present in the outermost surface of friction. It can be considered that the existence of the free O—H group is one of factors to generate FFO. The free O—H group is not detected from the surface of the Si-DLC shown by reference in FIGS. 28 and 29. Therefore, it can be said that the free O—H group is not present in common in the hard carbon based film.

Figure 30:
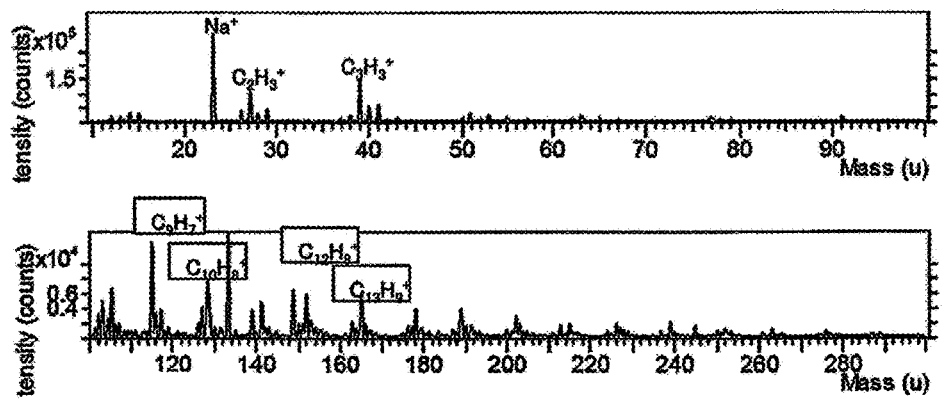
FIG. 30 is a graph showing a positive ion spectrum of an PLC film (a sliding region thereof) after the first friction test obtained by TOF-SIMS.
Figure 31:
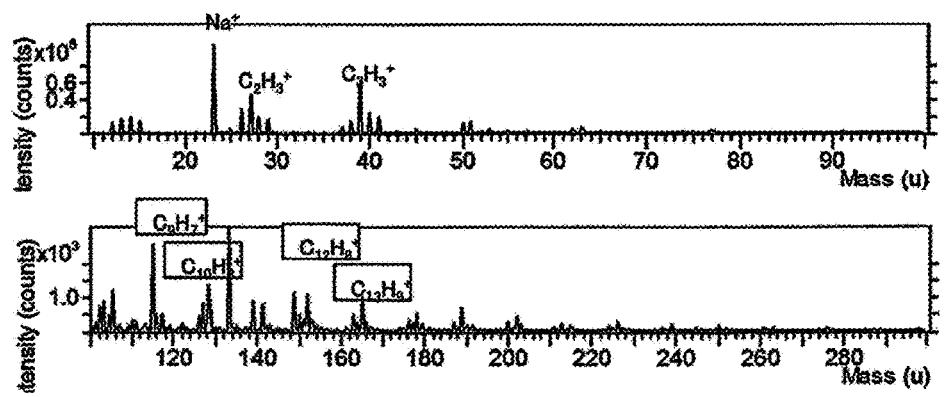
FIG. 31 is a graph showing a positive ion spectrum of the PLC film (a non-sliding region thereof) after the first friction test obtained by TOF-SIMS.
Figure 32:
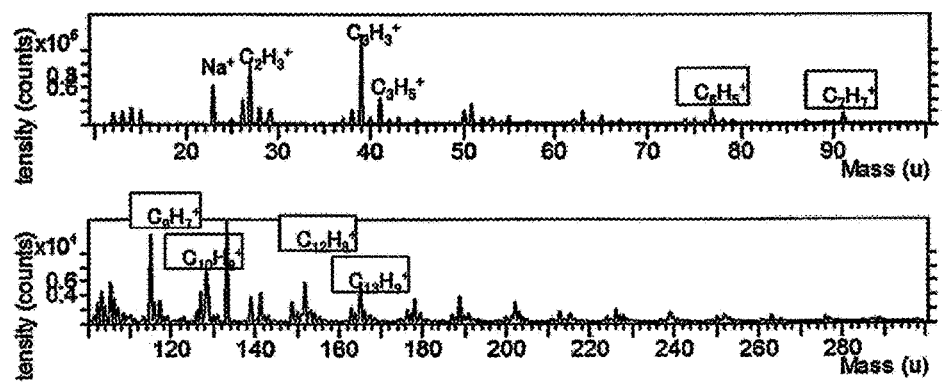
FIG. 32 is a graph showing a positive ion spectrum of an PLC film (a sliding region thereof) after the second friction test obtained by TOF-SIMS.
Figure 33:
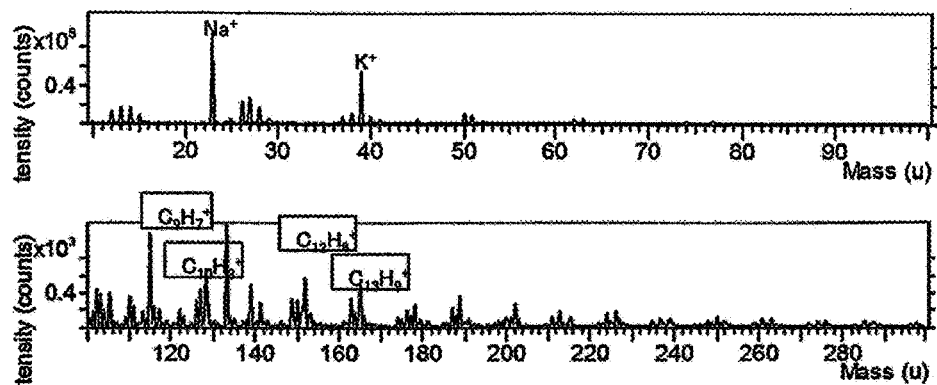
FIG. 33 is a graph showing a positive ion spectrum of the PLC film (a non-sliding region thereof) after the second friction test obtained by TOF-SIMS.

FIG. 30 is a graph showing a positive ion spectrum of the PLC film 63 (a sliding region thereof) after the first friction test obtained by TOF-SIMS. FIG. 31 is a graph showing a positive ion spectrum of the PLC film 63 (a non-sliding region thereof) after the first friction test obtained by TOF-SIMS. FIG. 32 is a graph showing a positive ion spectrum of the PLC film 63 (a sliding region thereof) after the second friction test obtained by TOF-SIMS. FIG. 33 is a graph showing a positive ion spectrum of the PLC film 63 (a non-sliding region thereof) after the second friction test obtained by TOF-SIMS.

Figure 34:
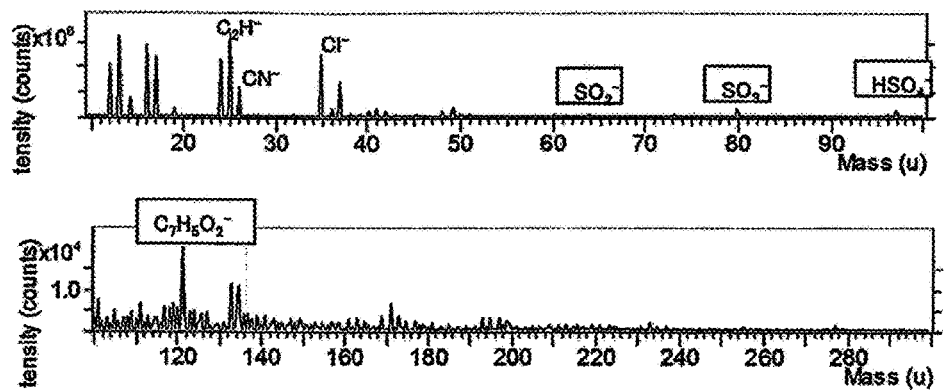
FIG. 34 is a graph showing a negative ion spectrum of an PLC film (a sliding region thereof) after the first friction test obtained by TOF-SIMS.
Figure 35:
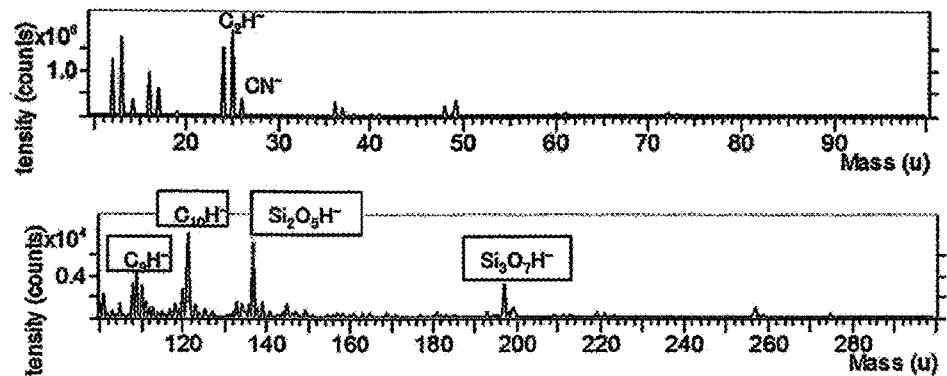
FIG. 35 is a graph showing a negative ion spectrum of the PLC film (a non-sliding region thereof) after the first friction test obtained by TOF-SIMS.
Figure 36:
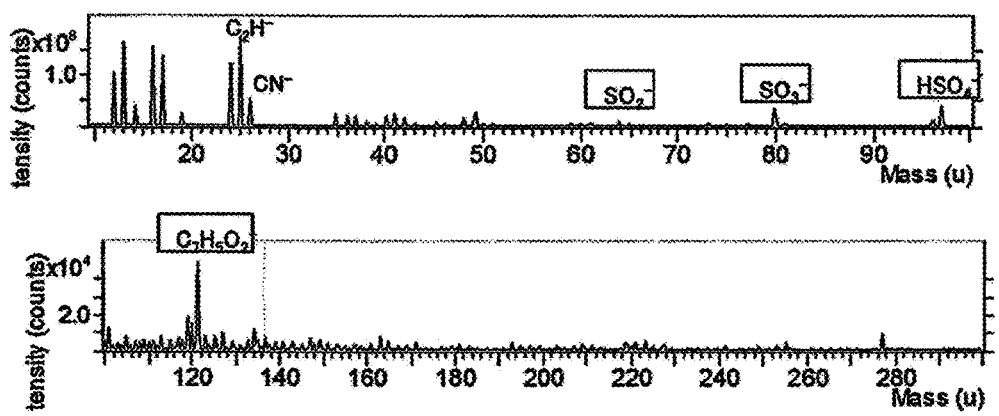
FIG. 36 is a graph showing a negative ion spectrum of an PLC film (a sliding region thereof) after the second friction test obtained by TOF-SIMS.
Figure 37:
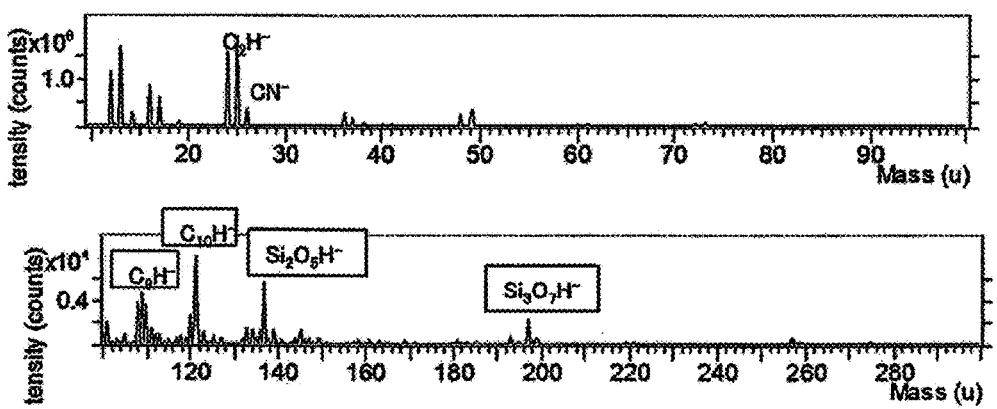
FIG. 37 is a graph showing a negative ion spectrum of the PLC film (a non-sliding region thereof) after the second friction test obtained by TOF-SIMS.

FIG. 34 is a graph showing a negative ion spectrum of the PLC film 63 (a sliding region thereof) after the first friction test obtained by TOF-SIMS. FIG. 35 is a graph showing a negative ion spectrum of the PLC film 63 (a non-sliding region thereof) after the first friction test obtained by TOF-SIMS. FIG. 36 is a graph showing a negative ion spectrum of the PLC film 63 (a sliding region thereof) after the second friction test obtained by TOF-SIMS. FIG. 37 is a graph showing a negative ion spectrum of the PLC film 63 (a non-sliding region thereof) after the second friction test obtained by TOF-SIMS.

From the spectra shown in FIGS. 30 to 37, existence of aromatic components ($C_6H_5^+$, $C_7H_7^+$), condensed ring based components ($C_9H_7^+$, $C_{10}H_8^+$, $C_{12}H_8^+$, $C_{13}H_9^+$), carbon based components ($C_9H^-$, $C_{10}H^-$), sulfur oxide based components ($SO_2^-$, $SO_3^-$, $HSO_4^-$), silica ions ($Si_2O_5H^-$, $Si_3O_7H^-$), and benzoic ions ($C_7H_5O_2^-$) can be recognized in the surface of the PLC film 63. It can be considered that the aromatic components, the condensed ring based components and the carbon based components derive from the PLC film 63.

The tendency for the aromatic components, the condensed ring based components, the benzoic ions and the sulfur oxide based components to be richer in the sliding region than in the non-sliding region could be recognized in the surface of the PLC film 63. On the other hand, a clear difference could not be recognized between the sliding region and the non-sliding region in the surface of the PLC film 63.

From above, according to the embodiment, the low-friction coating 5 includes an aliphatic hydrocarbon group showing a peak in a region of from 2,900 cm$^{-1}$ to 3,000 cm$^{-1}$ in an infrared absorption spectrum, a carbonyl group showing a peak in a region of from 1,650 cm$^{-1}$ to 1,800 cm$^{-1}$ in the infrared absorption spectrum, an aromatic component ($C_7H_7^+$) showing a peak at a mass of 91.1 in a positive ion spectrum obtained by TOF-SIMS, and a condensed ring based component ($C_9H_7^+$) showing a peak at a mass of 115.2 in the positive ion spectrum obtained by TOF-SIMS. The low-friction coating 5 having such physical properties shows an extremely low friction coefficient of 10$^{-4}$ order (lower than 0.001). That is, it is possible to provide the low-friction coating 5 which provides an extremely low friction coefficient.

In addition, it is possible to reduce the friction coefficient of the sliding surface 6 without using any additional lubricant.

Further, since the friction coefficient of the sliding surface 6 can be reduced extremely, it is possible to reduce a friction force generated between the sliding surface 6 and the slid surface 7 without using any additional lubricant. Thus, loss in friction caused by sliding of the sliding system 1 can be reduced on a large scale (friction torque can be reduced on a large scale). Accordingly, it is possible to reduce the size and weight of the sliding system 1, and it is possible to improve the reliability of the sliding system 1.

Although the embodiment of the invention has been described above, the invention can be implemented with another embodiment.

For example, although the aforementioned embodiment has been described on the assumption that the low-friction coating 5 has a configuration including a carbonyl group, a low-friction coating may have a configuration including no carbonyl group.

In addition, although the aforementioned embodiment has been described on the assumption that the low-friction coating 5 has a configuration including both an aromatic component ($C_7H_7^+$), and a condensed ring based component ($C_9H_7^+$), the low-friction coating 5 may have a configuration including at least one of the aromatic component ($C_7H_7^+$) and the condensed ring based component ($C_9H_7^+$).

Further, various changes in design can be made within the scope of items stated in the claims.

The present application is based on a Japanese patent application (Japanese Patent Application No. 2015-015850) filed on Jan. 29, 2015, a Japanese patent application (Japanese Patent Application No. 2015-015851) filed on Jan. 29, 2015, a Japanese patent application (Japanese Patent Application No. 2016-008236) filed on Jan. 19, 2016, and a Japanese patent application (Japanese Patent Application No. 2016-008237) filed on Jan. 19, 2016, the contents of which are incorporated herein by reference.

DESCRIPTION OF REFERENCE SIGNS

1 . . . sliding system, 2 . . . sliding member, 3 . . . slid member, 5 . . . low-friction coating (amorphous hydrocarbon based film, first coating), 6 . . . sliding surface, 7 . . . slid surface

The invention claimed is:
1. A sliding member comprising:
a sliding surface comprising a first coating,
wherein the sliding member is formed of at least one of metal and ceramics, and
wherein the first coating comprises an amorphous hydrocarbon based film, the amorphous hydrocarbon based film comprising:
an aliphatic hydrocarbon group showing a peak in a region of from 2,900 cm$^{-1}$ to 3,000 cm$^{-1}$ in an infrared absorption spectrum; and
at least one of an aromatic component showing a peak at a mass of 91.1 in a positive ion spectrum obtained by time-of-flight secondary ion mass spectrometry and a condensed ring based component showing a peak at a mass of 115.2 in the positive ion spectrum obtained by the time-of-flight secondary ion mass spectrometry.

2. The sliding member according to claim 1, wherein the amorphous hydrocarbon based film further comprises:
   a carbonyl group showing a peak in a region of from 1,650 $cm^{-1}$ to 1,800 $cm^{-1}$ in an infrared absorption spectrum.

3. The sliding member according to claim 1, wherein the amorphous hydrocarbon based film comprises both the aromatic component and the condensed ring based component.

4. The sliding member according to claim 1,
   wherein an average thickness of the amorphous hydrocarbon based film is 2 nm to 1,000 nm.

5. The sliding member according to claim 1,
   wherein the sliding member is formed of $ZrO_2$.

6. A sliding system comprising:
   the sliding member according to claim 1; and
   a slid member comprising a slid surface sliding against the sliding surface and comprising a second coating made of an amorphous carbon based film,
   wherein the second coating has a Young's modulus of 200 GPa to 250 GPa.

7. The sliding system according to claim 6,
   wherein the second coating comprises a hydroxyl group in an outermost surface thereof, the hydroxyl group showing a peak in a region of from 3,000 $cm^{-1}$ to 4,000 $cm^{-1}$ in an infrared absorption spectrum.

8. The sliding system according to claim 6,
   wherein the second coating comprises polymer-like carbon.

* * * * *